United States Patent
Xue et al.

(10) Patent No.: US 7,466,758 B2
(45) Date of Patent: Dec. 16, 2008

(54) METHOD AND SYSTEM FOR DYNAMIC INTERLEAVER ADAPTATION SCHEME IN VDSL

(75) Inventors: Tao Xue, Irvine, CA (US); Massimo Sorbara, Freehold, NJ (US); Ho-Ming Lin, Irvine, CA (US)

(73) Assignee: Conexant Systems, Inc., Newport Beach, CA (US)

(*) Notice: Subject to any disclaimer, the term of this patent is extended or adjusted under 35 U.S.C. 154(b) by 222 days.

(21) Appl. No.: 11/297,632

(22) Filed: Dec. 9, 2005

(65) Prior Publication Data

US 2006/0153308 A1 Jul. 13, 2006

Related U.S. Application Data

(60) Provisional application No. 60/656,019, filed on Feb. 25, 2005, provisional application No. 60/643,309, filed on Jan. 13, 2005, provisional application No. 60/634,260, filed on Dec. 9, 2004.

(51) Int. Cl.
*H04L 5/12* (2006.01)
*H03M 13/00* (2006.01)

(52) U.S. Cl. .................. 375/262; 375/265; 714/756

(58) Field of Classification Search ............... 375/262, 375/265, 298; 714/708, 756, 759
See application file for complete search history.

(56) References Cited

U.S. PATENT DOCUMENTS 5,764,649 A * 6/1998 Tong ........................ 714/701

6,088,390 A * 7/2000 Russell et al. ............... 375/233
6,151,690 A 11/2000 Peeters

FOREIGN PATENT DOCUMENTS

JP 02000332618 A * 11/2000

OTHER PUBLICATIONS

SI-090, "VDSL2—Error Free Rate Adaptation and Rate Repartitioning", Texas Instruments, Cory Modlin, Oct. 18-22, 2004, Stresa, Italy ("SI-090").
D.130, "G.VDSL: VDSL2 Seamless DRR Requirements", Alcatel Bell, Danny Van Bruyssel, Nov. 29-Dec. 3, 2004, Geneva ("D.130").
D.131, "G.VDSL: VDSL2 Seamless DRR using a Dynamic Interleaver", Alcatel Bell, Danny Van Bruyssel, Nov. 29-Dec. 3, 2004, Geneva ("D.131").

* cited by examiner

*Primary Examiner*—Young T. Tse
(74) *Attorney, Agent, or Firm*—Thomas, Kayden, Horstemeyer & Risley, LLP

(57) ABSTRACT

The present invention provides a method and apparatus for a new interleaver adaptation scheme that achieves "error free" and zero delay (interleaving—triangular) or near zero delay variation (interleaving—GCI), and with easier implementation but no additional memory required. The dummy insertion methods and systems embodiments of the invention provide an effective dummy byte insertion scheme for applications that require seamless on-line rate changes, e.g., SRA (seamless rate adaptation), DRR (dynamic rate repartitioning) and adaptive INP (impulse noise protection).

26 Claims, 28 Drawing Sheets

FIG. 8

Decrease of D (HH-085)

D=17, M=3, l=5, x=2
Delay=64

D=18, M=3, l=5, x=3
Delay=68

The 4 positive dummies to be inserted at the 4th block is offset by the 3 negative dummies in the 3rd block, leaving no dummies inserted at the 3rd block and only 1 dummy inserted at the 4th block

METHOD AND SYSTEM FOR DYNAMIC INTERLEAVER ADAPTATION SCHEME IN VDSL

CROSS-REFERENCE TO RELATED APPLICATIONS

The present application claims priority to U.S. Provisional Application 60/634,260, filed Dec. 9, 2004, entitled Method and System For Dynamic Interleaver Adaptation Scheme in VDSL; and to U.S. Provisional Patent Application 60/643,309, filed Jan. 13, 2005, entitled Dynamic Interleaver Reconfiguration; and to U.S. Provisional Patent Application 60/656,019, filed Feb. 25, 2005, entitled Dynamic Interleaver Reconfiguration, each of the above-referenced applications being incorporated herein by reference in their entirety.

BACKGROUND

The present invention relates generally to the field of telecommunications and, more particularly, to delivering services over telephone (switched) networks (POTS, PSTN) and leased point-to-point two-wire telephone type circuits, such as via modems or other forms of transceivers operating over twisted pair. An exemplary system might have a data signaling rate of 33600 bits/second. For example, multi-channel, multi-carrier communications systems such as discrete multi-tone (DMT) systems may be used.

The explosive growth of the Internet has created a demand for high data rates for business and residential users (SOHO—small office/house office) that rely on standard analog plain old telephone systems (POTS) that use a copper wire twisted pair to carry the information. The need for high-speed access to the home is increasing due to the availability of information, data, high-bandwidth video and the like, such as from the world wide web. Because of such demand, higher speed modems are required; modems operating at rates of for example 33,600 bits/second are now in use. A multitude of competing communication technologies provide high-speed access to the home such as cable modems and digital subscriber line (xDSL) equipment. DSL equipment may utilize the existing analog POTS that use a copper wire twisted pair to carry the information. Because of bandwidth limitation (4 KHz), and power limitation of the telephone network, line coding schemes are used to encode digital signals into analog signals that convey the analog information over the analog telephone network. Such line coding schemes should avoid the undesirable bandwidth or power increase.

Line coding schemes manipulate the analog carrier signal, which has three attributes, amplitude, phase and frequency. One or more of such attributes may be manipulated by known modulation techniques. One such technique is quadrature amplitude modulation (QAM) whereby the carrier signal's phase and amplitude is modulated to encode more data within a frequency bandwidth. One example of a QAM modulation system sends two bits of information per QAM symbol, where the digital values can be encoded and the corresponding amplitude and phase can be represented using the constellation.

Data from a personal computer or other equipment at the customer premise (CPE) are sent to a transmitter, which arranges the data into frame packets. The packetized signal is then quadrature amplitude modulation encoded and error encoded using trellis encoding to improve the noise immunity using a convolutional coder to select a sequence of subsets in a partitioned signal constellation. A numerical symbol vector is trellis encoded. The trellis encoding starts with the most significant symbol and ends with the least significant symbol of the vector, a process which employs convolutional encoding that converts the input symbol to another symbol and then maps the encoded symbol to its corresponding 16 QAM signal constellation point.

VDSL, which is referenced generally and shall be used herein to include where appropriate progeny such as VDSL2, provides symmetric and asymmetric bandwidth and VDSL reference standards have been developed by International Telecommunications Union (ITU-T), American National Standards Institute (ANSI) T1/E1, and European Telecommunications Standards Institute (ETSI). Standards of particular interest are T1.424; ITU G.993.1; TS101 270-1; and TS101 270-2, all of which are incorporated herein by reference. Also, the dynamic interleaver adaptation scheme is intended for use with adopted VDSL triangular interleaver as well as with a soon to be adopted convolutional triangular interleaver for VDSL2.

A conventional multi-carrier VDSL system normally consists of a data-to-symbol converter, an IFFT (Inverse Fast Fourier Transform), a cyclic extension adder, D/A (digital-to-analog) converter for its transmitter, and an A/D (analog-to-digital) converter, a FFT (Fast Fourier Transform), a frequency domain equalizer, and a symbol-to-data converter for its receiver.

SUMMARY OF INVENTION

One embodiment of the present invention is a communications system having an adaptive interleaver scheme that comprises an interleaver adapted to receive data and to interleave the received data to thereby generate interleaved data, and a de-interleaver adapted to receive the interleaved data and to de-interleave the received interleaved data to thereby generate data essentially equivalent to the received data. The interleaver defines a dummy insertion pattern in the received data prior to reordering of the received data to thereby form transition data to effect interleaver depth (D) and interleaver shape and to accommodate interleaver line rates to minimize delay variations and to maintain impulse noise protection (INP).

Another embodiment of the present invention is a communications system that comprises an encoder adapted to receive and encode a signal and generate an encoded signal, an interleaver adapted to receive and to interleave the encoded signal to thereby generate an interleaved encoded signal, the interleaver defining a dummy insertion pattern in the received signal prior to reordering of the received signal to thereby form a transition signal to effect interleaver depth (D) and interleaver shape and to accommodate interleaver line rates to minimize delay variations and to maintain impulse noise protection (INP), a modulator that modulates the interleaved encoded signal to generate an encoded, interleaved, modulated signal, a demodulator receiving and demodulating the modulated interleaved encoded signal and generating a demodulated interleaved encoded signal, a de-interleaver adapted to receive and deinterleave the demodulated interleaved encoded signal and generate a deinterleaved demodulated encoded signal, and a decoder adapted to decode the deinterleaved demodulated encoded signal and generate an output signal essentially equivalent to the received signal.

Another embodiment of the present invention is a communications system having an adaptive interleaver scheme comprising an interleaver means for receiving data and interleaving the received data to thereby generate interleaved data, and a de-interleaver means for receiving the interleaved data and deinterleaving the received interleaved data to thereby generate data essentially equivalent to the received data. The interleaver means defines a dummy insertion pattern in the received data prior to reordering of the received data to thereby form transition data to effect interleaver depth (D) and interleaver shape and to accommodate interleaver line rates to minimize delay variations and to maintain impulse noise protection (INP).

Another embodiment of the present invention is a communications system comprising: an encoder adapted to receive and encode a signal and generate an encoded signal; an interleaver means for receiving and interleaving the encoded signal to thereby generate an interleaved encoded signal, the interleaver means defining a dummy insertion pattern in the received signal prior to reordering of the received signal to thereby form a transition signal to effect interleaver depth (D) and interleaver shape and to accommodate interleaver line rates to minimize delay variations and to maintain impulse noise protection (INP); a modulator that modulates the interleaved encoded signal to generate an encoded, interleaved, modulated signal;

a demodulator receiving and demodulating the modulated interleaved encoded signal and generating a demodulated interleaved encoded signal; a de-interleaver means for receivig and deinterleaving the demodulated interleaved encoded signal and generate a deinterleaved demodulated encoded signal; and a decoder adapted to decode the deinterleaved demodulated encoded signal and generate an output signal essentially equivalent to the received signal.

Another embodiment of the present invention is a method of performing an adaptive interleaver scheme comprising: receiving data at an interleaver and interleaving the received data to thereby generate interleaved data;

receiving at a deinterleaver the interleaved data and deinterleaving the received interleaved data to thereby generate data essentially equivalent to the received data; and defining at the interleaver a dummy insertion pattern in the received data prior to reordering of the received data to thereby form transition data to effect interleaver depth (D) and interleaver shape and to accommodate interleaver line rates to minimize delay variations and to maintain impulse noise protection (INP).

One inventive aspect provides a method and apparatus for a new interleaver adaptation scheme that achieves "error free" and zero delay (interleaving—triangular) or near zero delay variation (interleaving—GCI), and with easier implementation but no additional memory required.

The invention is disclosed or use in both directions, decrease in rate M and increase in rate M. Although the invention may be described in the particular embodiments of decrease in rate M4 to M3 and increase in rate M3 to M4, it should be understood that those skilled in the art would appreciate and know how to adopt the formulas and schemes herein disclosed to effect other rate increases/decreases. The invention relates to transceivers and applies in data transmitted in a bi-directional manner.

BRIEF DESCRIPTION OF THE DRAWINGS

FIG. 8 is a data stream representation of an exemplary negative dummy byte insertion scenario for implementation with the first and second embodiments of the present invention.

FIG. 9 is a data stream representation of an exemplary negative dummy byte insertion scenario for implementation with the first and second embodiments of the present invention.

FIG. 10 is a data stream representation of an exemplary negative dummy byte insertion scenario for implementation with the third embodiment of the present invention.

FIG. 22 is a data stream representation of a first embodiment of the present invention dynamic interleaver configuration scheme.

DETAILED DESCRIPTION OF INVENTION

The present invention provides a dynamic interleaver configuration to effect improved performance and aspects of the invention provide one or more of: INP preservation throughout transition; zero delay variation; reduced memory requirements; error-free operation; versatility between triangular and GCI interleaver; and versatility in granularity in interleaving depth.

First, we address the design of a dynamic interleaver for seamless depth transition and in particular with respect to a triangular interleaver and the triangular interleaver implementation of a general convolutional interleaver (GCI).

Figure 1:
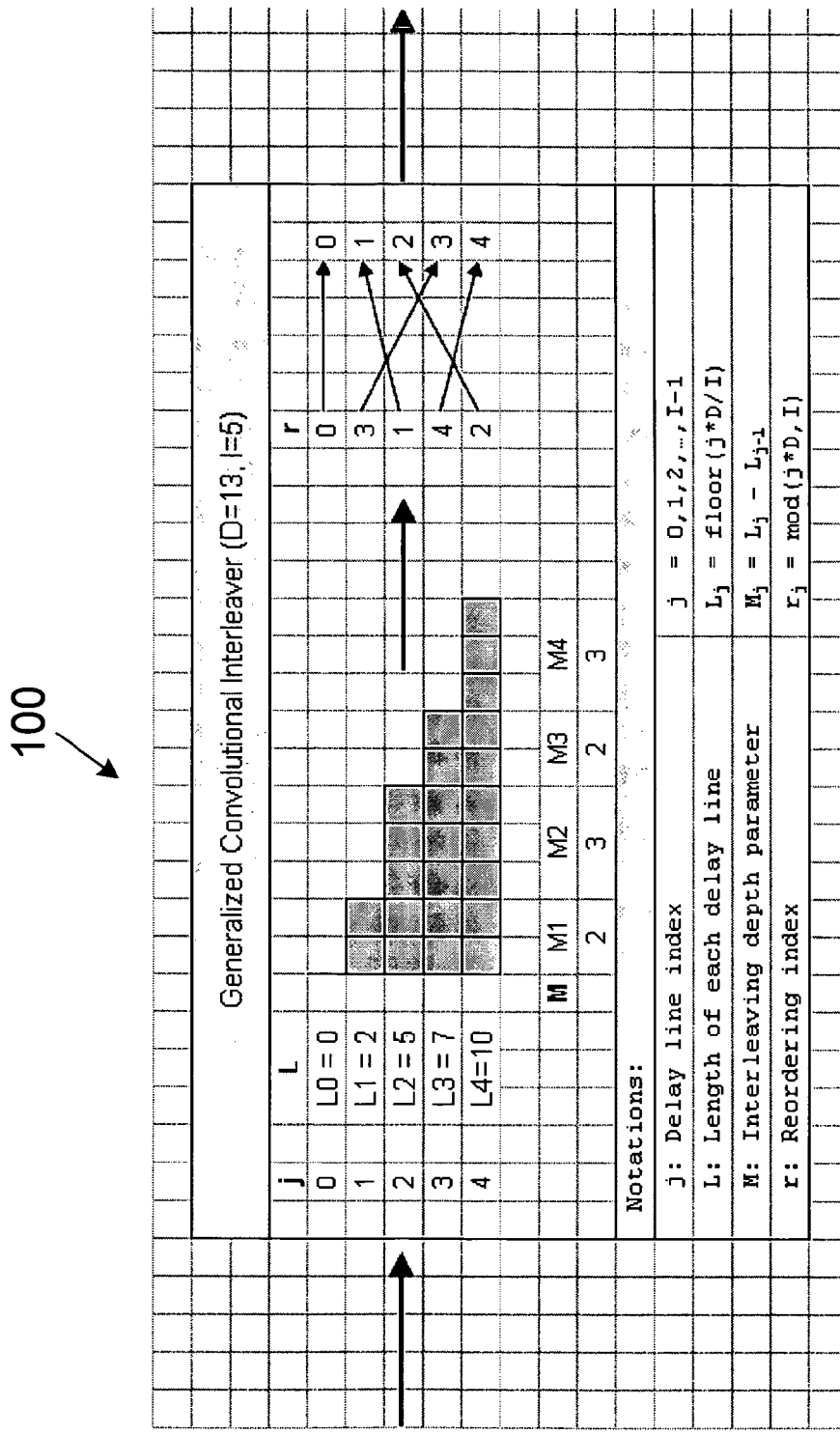
FIG. 1 is a data stream representation of an exemplary triangular implementation of GCI for use in the present invention.

There are different ways to implement a GCI. In the example discussed here for illustrative purposes and not by way of limitation, the triangular implementation of GCI 100, as shown in FIG. 1, defines how dummy bytes are inserted based on the dynamic interleaver schemes proposed hereinbelow. The notations used in this description include: j—delay line index; L—length of each delay line; M—interleaving depth parameter; and r—reordering index. FIG. 1 provides definitions for the notations j, $L_j$, $M_j$, and $r_j$. Unless otherwise provided herein the notations and definitions thus described will be used throughout this specification. In accordance with this exemplary interleaver, during the transition the rate is changed from $Rate_1$ to $Rate_2$ and the interleaving depth is changed from $D_1$ to $D_2$. Based on the definition of M in FIG. 1, we define $M_j$ for the interleaver with larger D=Max($D_1$, $D_2$), define $M'_j$ for the interleaver with smaller D=Min($D_1$, $D_2$), and define $\Delta M_j = M_j - M'_j$. The term "fast data" represents the data bytes with faster rate, whereas "slow data" represents the data bytes with slower rate.

Figure 2:
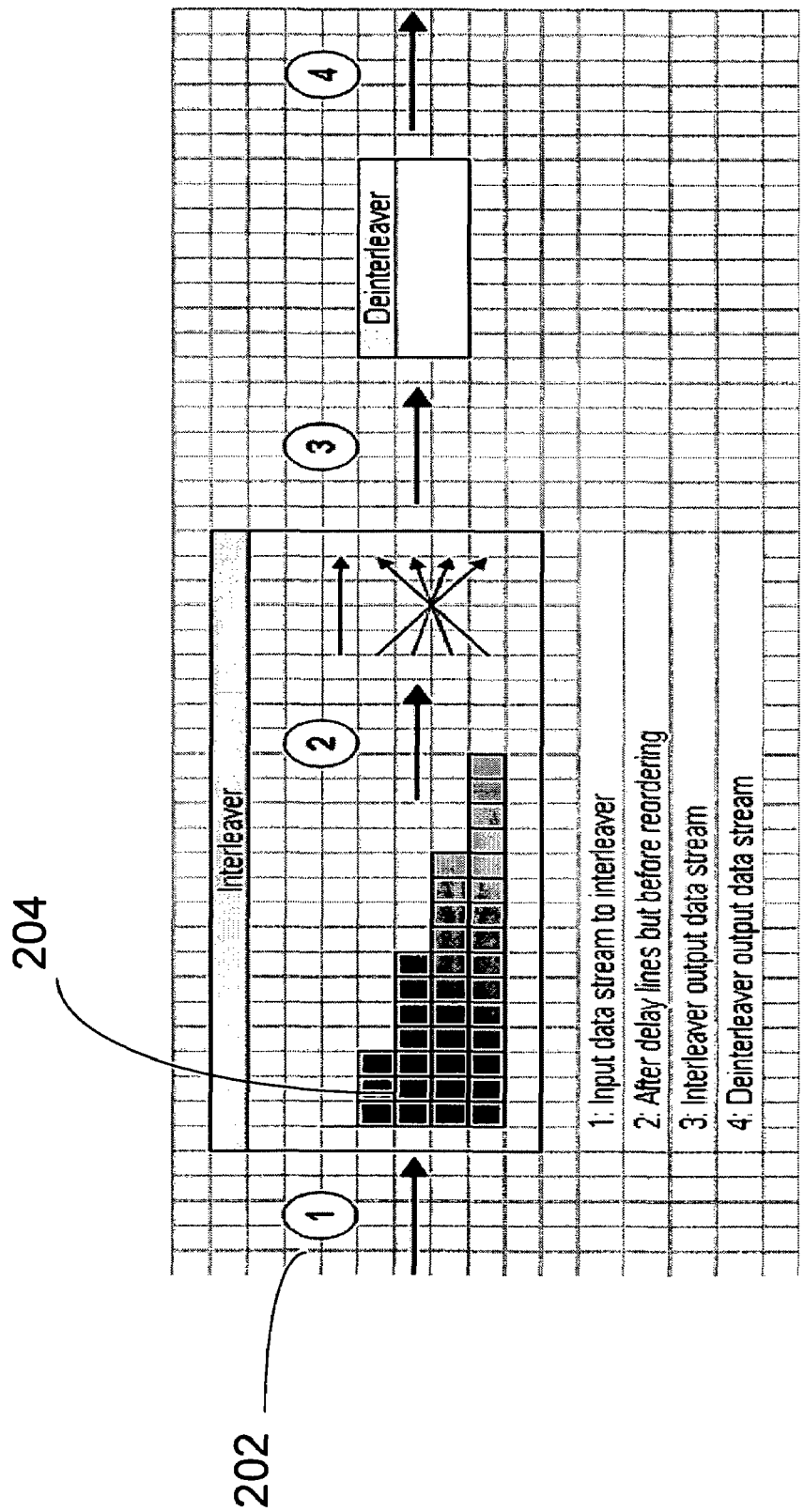
FIG. 2 is a data stream representation of an interleaving data stream for implementation with the first and second embodiments of the present invention for output dummy insertion.

FIG. 2 is a data stream representation of an interleaving data stream for implementation with embodiments of the disclosure for output dummy insertion reference numeral 202 corresponds to data input to a data interleaver reference numeral 204 corresponds to output dummy insertion interleaver output data stream can be output to a deinterleaver. Now with reference to FIG. 3, for example in data stream (1) 302 the data bytes 304 are "fast data" and the data bytes 306 are "slow data." While in FIG. 4, the data bytes 404 are "slow data" and the data bytes 406 are "fast data" in data stream (1) 402.

Figure 3:
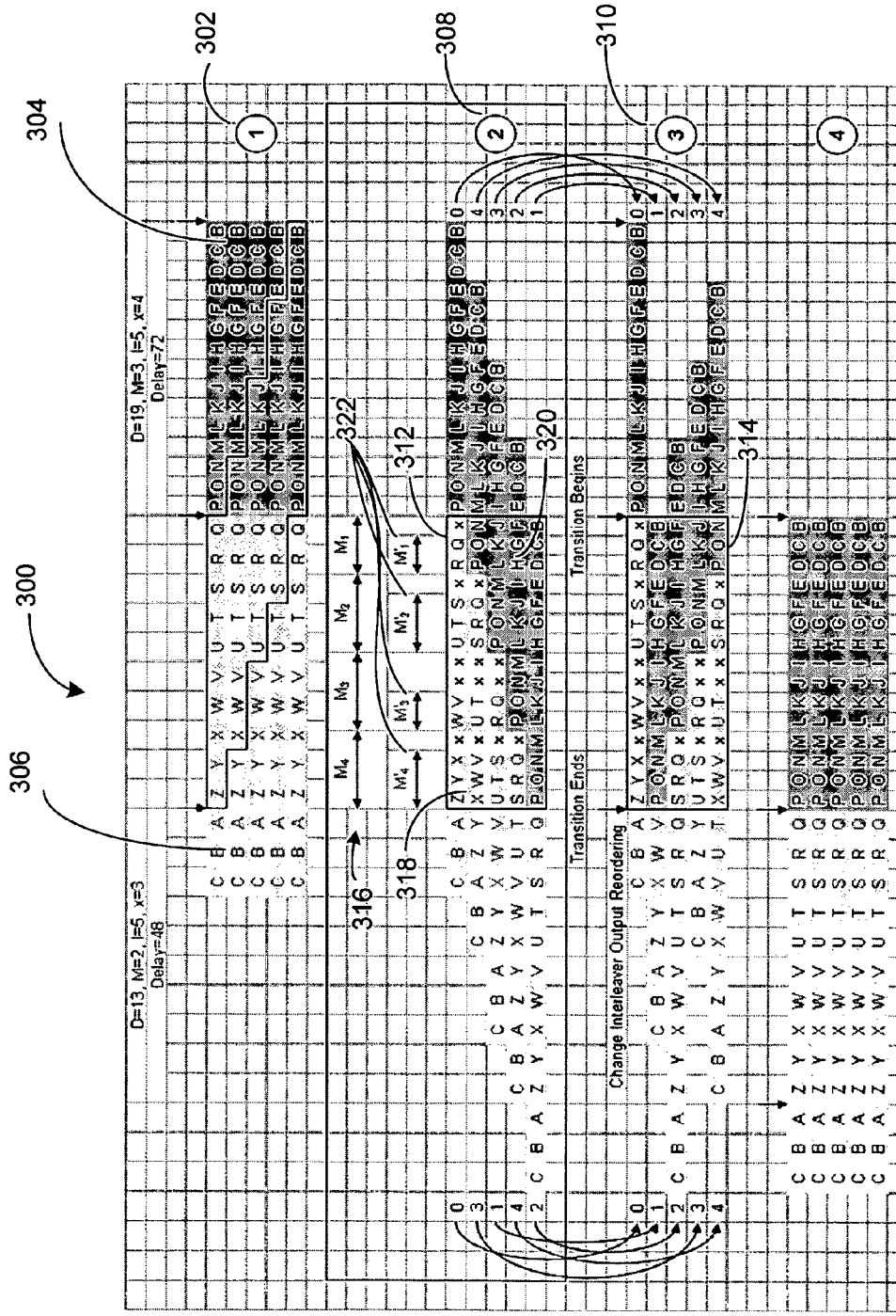
FIG. 3 is a data stream representation of an exemplary output dummy insertion pattern for "Decrease of D" for implementation with the first and second embodiments of the present invention.

The term "transition data" represents the data bytes transmitted during transition period at the interleaver output, whereas the data bytes transmitted during non-transition period are "non-transition data." For example, in data stream (2) 308 or (3) 310 of FIG. 3, the data bytes 312 and 314, respectively, enclosed within the rectangle (between "transition begins" and "transition ends") are "transition data," the other data bytes, i.e., those outside the rectangle, are "non-transition data."

Figure 4:
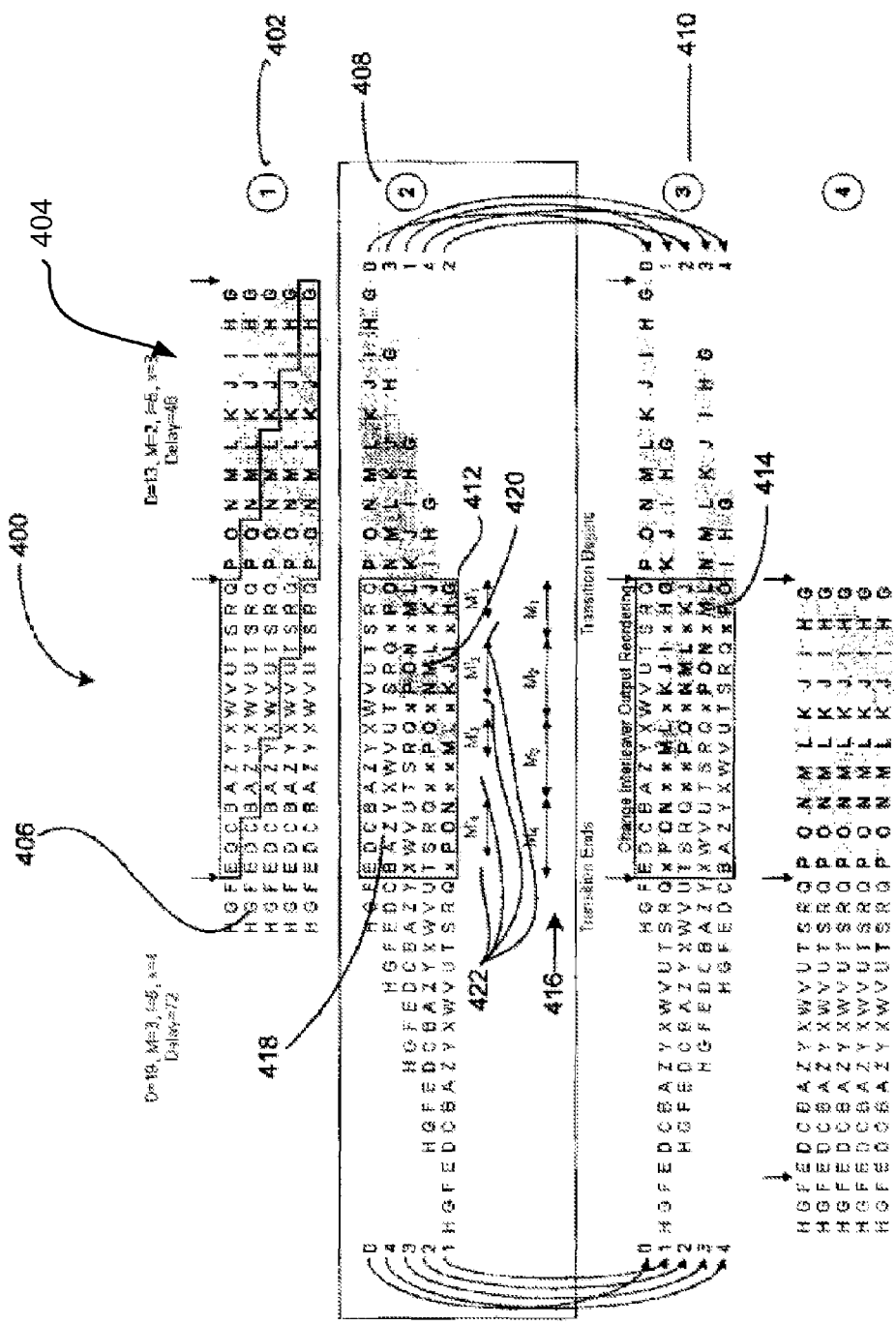
FIG. 4 is a data stream representation of a dummy insertion pattern for "Increase of D" for implementation with the first and second embodiments of the present invention.

FIGS. 2 through 4 illustrate one exemplary set of dummy patterns illustrating a first embodiment of the present output dummy insertion method and system. In the exemplary embodiment of FIG. 3, the following rules define the dummy insertion pattern for "Decrease of D" transition of HH-085. The dummy insertion pattern is defined in the data stream after the triangular delay lines but before the reordering as shown in (2) 308 of FIG. 3. In data stream (2) 308 of FIG. 3, from right to left, the rectangle 312 of the "transition data" can be divided into (I−1) blocks and referenced as the $1^{st}$ block with $M_1*I$ bytes ($M_1$ columns), . . . , the $j^{th}$ block with $M_j*I$ bytes ($M_j$ columns), . . . , until the $(I−1)^{th}$ block. Within each block 316, represented as $M_1$, $M_2$, $M_3$, and $M_4$, the data is composed of "slow data" 318 at the top and "fast data" 320 at the bottom. For the $j^{th}$ block, insert $\Delta M_j*j$ dummy bytes. These dummy bytes, represented as "x", are in $\Delta M_j$ columns, 322, each with j bytes. They are all inserted at the beginning (right-most) of the "slow data" 318 section within each block 316.

In the exemplary embodiment of FIG. 4, the following rules define the dummy insertion pattern for "Increase of D" transition of HH-085. The dummy pattern is defined in the data stream after the triangular delay lines but before the reordering, as shown in (2) 408 of FIG. 4. In data stream (2) 408 of FIG. 4, from right to left, the rectangle 412 of the "transition data" can be divided into (I−1) blocks and referenced as the $1^{st}$ block with $M_1*I$ bytes ($M_1$ columns), . . . , the $j^{th}$ block with $M_j*I$ bytes ($M_j$ columns), . . . , until the $(I−1)^{th}$ block. Within each block 416, the data is composed of "fast data" 418 at the top and "slow data" 420 at the bottom. For the $j^{th}$ block, insert $\Delta M_j*(I-j)$ dummy bytes. These dummy bytes x are in $\Delta M_j$ columns, each with (I−j) bytes. They are all inserted at the end (left-most) of the "slow data" 420 section within each block 416.

Figure 6:
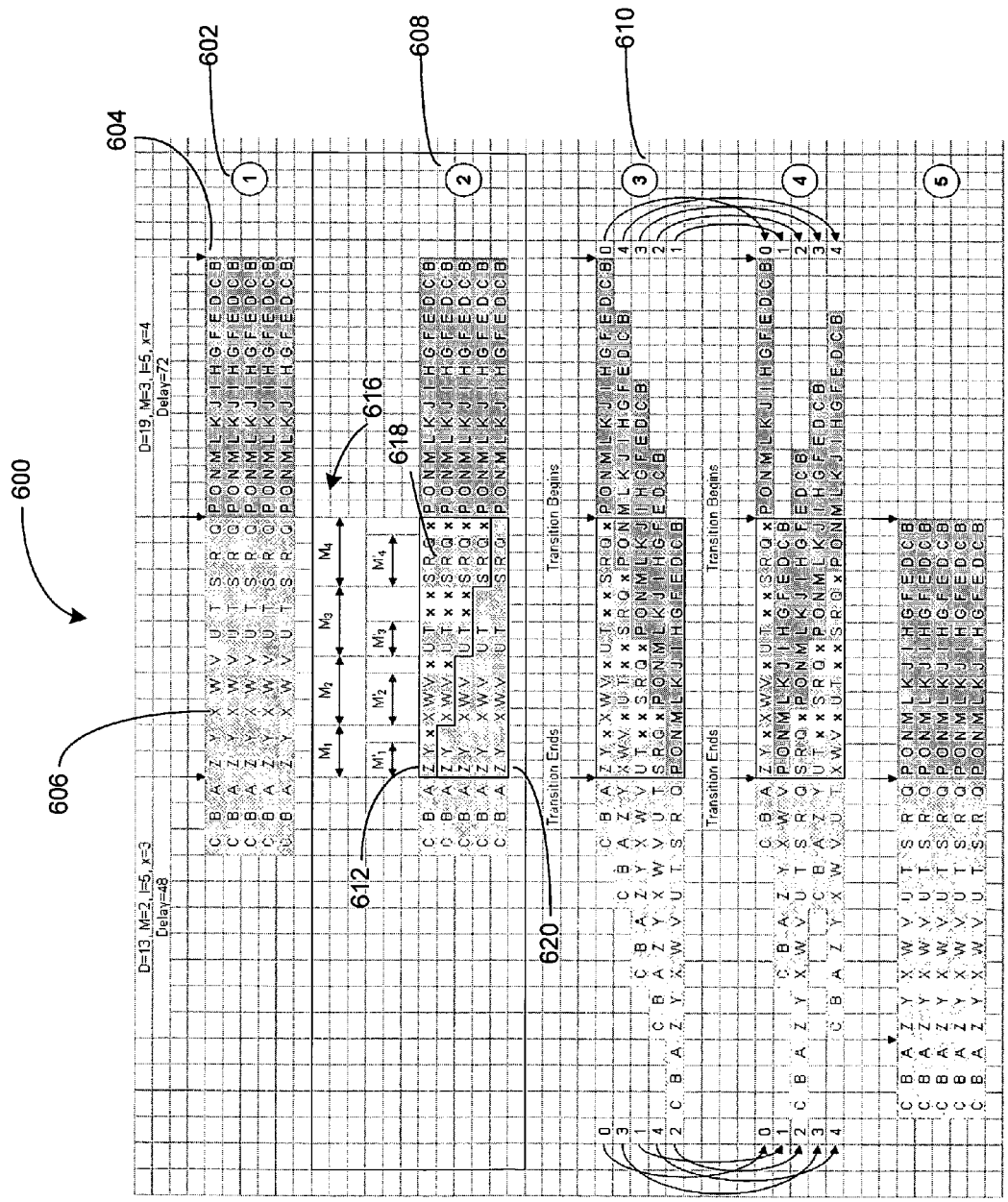
FIG. 6 is a data stream representation of a dummy insertion pattern for "Decrease of D" for implementation with the third embodiment of the present invention.
Figure 7:
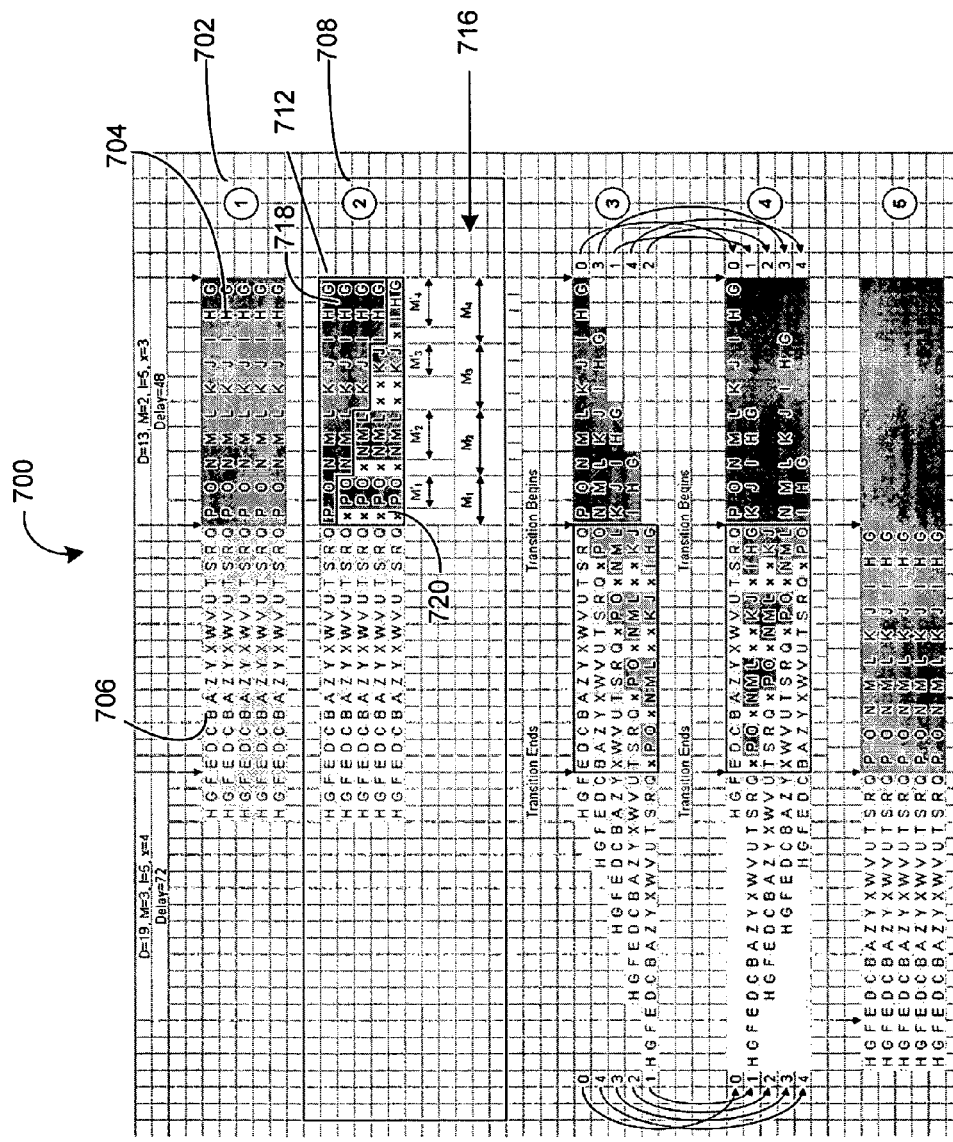
FIG. 7 is a data stream representation of a dummy insertion pattern for "Increase of D" for implementation with the third embodiment of the present invention.

Now with reference to FIG. 6, for example in data stream (1) 602 the data bytes 604 are "fast data" and the data bytes 606 are "slow data." While in FIG. 7, the data bytes 704 are "slow data" and the data bytes 706 are "fast data" in data stream (1) 702.

Figure 5:
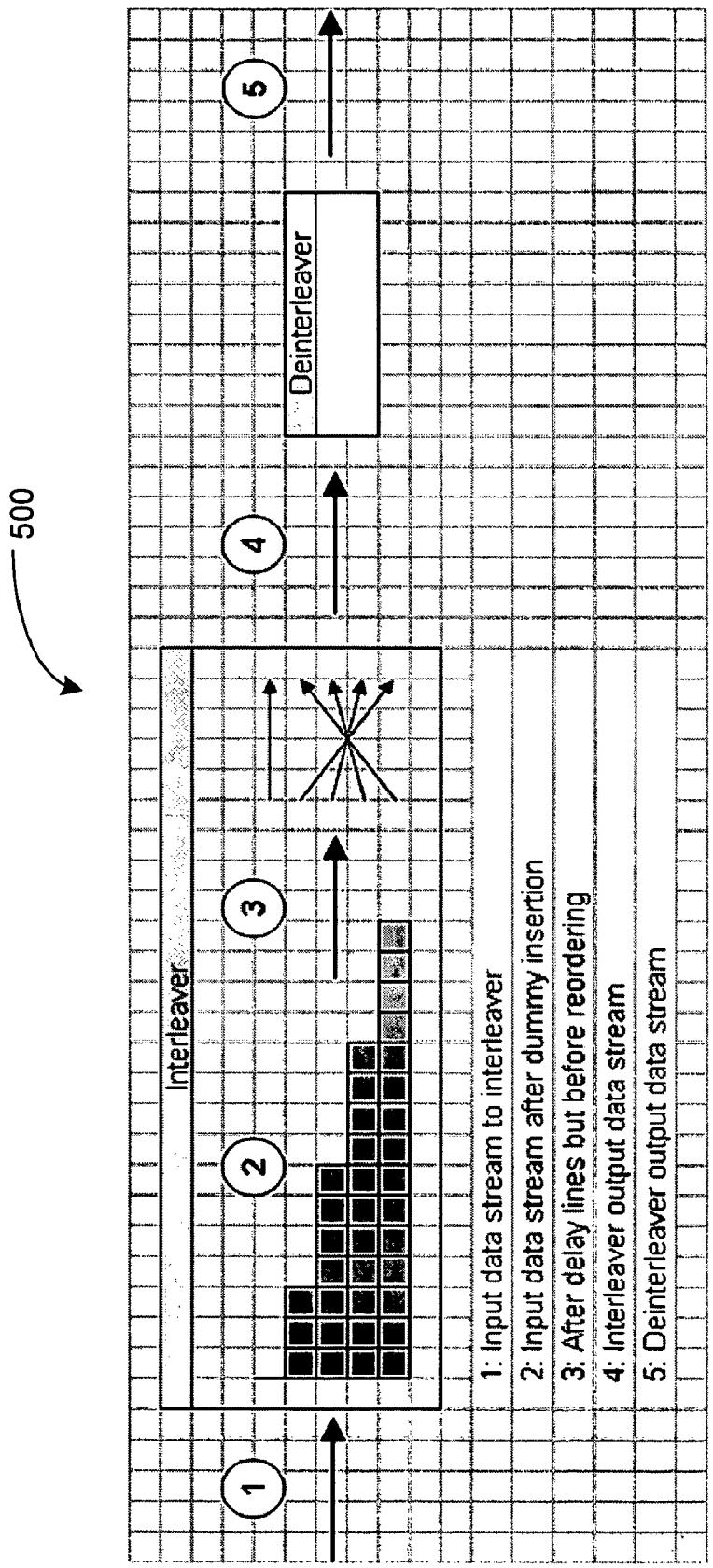
FIG. 5 is a data stream representation of an interleaving data stream for implementation with the third embodiment of the present invention for input dummy insertion.

FIGS. 5 through 7 illustrate one exemplary set of dummy patterns illustrating an embodiment of the present input dummy insertion method and system. In the exemplary embodiment of FIG. 6, the following rules define the dummy insertion pattern for the "Decrease of D" transition of HH-086. The dummy pattern is defined in the input data stream after dummy insertion (not going through the triangular delay lines yet), as shown in (2) 608 of FIG. 6. In data stream (2) 608 of FIG. 6, from left to right, starting from the transition end point, the rectangle 612 of the "slow data" can be divided into (I−1) blocks as referenced as the $1^{st}$ block with $M'_1*I$ bytes ($M'_1$ columns), . . . , the $j^{th}$ block with $M'_j*I$ bytes ($M'_j$ columns), . . . , until the $(I−1)^{th}$ block. Within each block 616, represented as $M_1$, $M_2$, $M_3$, and $M_4$, the data is composed of "transition data" 618 at the top and "non-transition data" 620 at the bottom. For the $j^{th}$ block, insert $\Delta M_j*j$ dummy bytes. These dummy bytes x are in $\Delta M_j$ columns, each with j bytes. The dummy bytes x are all inserted at the beginning (right-most) of the "transition data" section within each block 616.

In the exemplary embodiment of FIG. 7, the following rules define the dummy insertion pattern for "Increase of D" transition of HH-086. The dummy pattern is defined in the input data stream after dummy insertion (not going through the triangular delay lines yet), as shown in (2) 708 of FIG. 7.

In data stream (2) 708 of FIG. 7, from left to right, starting from the transition beginning point, the rectangle 712 of the "slow data" can be divided into (I−1) blocks—the 1$^{st}$ block with M'$_1$*I bytes (M'$_1$ columns), . . . , the j$^{th}$ block with M'$_j$*I bytes (M'$_j$ columns), . . . , until the (I−1)$^{th}$ block. Within each block, represented as M$_1$, M$_2$, M$_3$, and M$_4$, the data is composed of "non-transition data" 718 at the top and "transition data" 720 at the bottom. For the j$^{th}$ block, insert ΔM$_j$*(I−j) dummy bytes. These dummy bytes are in ΔM$_j$ columns, each with (I−j) bytes, and are all inserted at the end (left-most) of the "transition data" section within each block 716.

The interleaver design so far discussed can handle extreme cases, e.g., when ΔM$_j$<0. Above, in the case of the triangular implementation of GCI, we defined M$_j$ for the interleaver with larger D=Max(D$_1$,D$_2$), defined M'$_j$ for the interleaver with smaller D=Min(D$_1$,D$_2$), and defined ΔM$_j$=M$_j$−M'$_j$. From the rules described above with respect to the inventive dummy insertion methods, the number of dummy bytes x inserted is based on ΔM$_j$. Initially it may appear that the rules require that ΔM$_j$ be greater than or equal to zero, because "negative" dummy bytes cannot be inserted into the data stream. But with some special handling, the rules can be extended to handle "negative" ΔM$_j$ cases. For instance, Table 1 shows an example of how the interleaver design may handle a "negative" ΔM$_j$.

TABLE 1

| j | 1 | 2 | 3 | 4 |
|---|---|---|---|---|
| M$_j$ (D$_1$ = 18, I = 5) | 3 | 4 | 3 | 4 |
| M'$_j$ (D$_2$ = 17, I = 5) | 3 | 3 | 4 | 3 |
| ΔM$_j$ | 0 | 1 | −1 | 1 |

The following describes conditions under which a "negative" ΔM$_j$ may happen. First, if D=M*I+x, then M$_j$ will be either M or M+1. Based on the definition of M$_j$ the following results:

$$L_j = \left\lfloor \frac{j \cdot D}{I} \right\rfloor = \left\lfloor \frac{j \cdot (M \cdot I + x)}{I} \right\rfloor = j \cdot M + \left\lfloor \frac{j \cdot x}{I} \right\rfloor; \quad (1)$$

$$L_{j-1} = \left\lfloor \frac{(j-1) \cdot D}{I} \right\rfloor \quad (2)$$
$$= \left\lfloor \frac{(j-1) \cdot (M \cdot I + x)}{I} \right\rfloor$$
$$= (j-1) \cdot M + \left\lfloor \frac{(j-1) \cdot x}{I} \right\rfloor;$$

$$M_j = L_j - L_{j-1} = M + \left\lfloor \frac{j \cdot x}{I} \right\rfloor - \left\lfloor \frac{(j-1) \cdot x}{x} \right\rfloor. \quad (3)$$

Since x<I, the following results:

$$0 \le \left\lfloor \frac{j \cdot x}{I} \right\rfloor - \left\lfloor \frac{(j-1) \cdot x}{I} \right\rfloor \le 1. \quad (4)$$

Therefore, based on Equations (3) and (4):

$$M_j = M \text{ or } M+1 \quad (5)$$

Next, if D=M*I+x and D'=M'*I+x' (D>D'), then only when M=M' will the negative ΔM$_j$ happen. Based on the conclusion (5), M$_j$ is either M or M+1, M'$_j$ is either M' or M'+1. If M>M', then there is no way that ΔM$_j$ (=M$_j$−M'$_j$) could be negative because Min(M$_j$)=M≧M'+1=Max(M'$_j$). Only where M=M' could ΔM$_j$ be less than zero (when M$_j$=M and M'$_j$=M'+1). When "negative" ΔM$_j$ occurs, then M must be equal to M' and there are only three possible ΔM$_j$ values: 1, 0, or −1. The "negative" ΔM$_j$ may be handled by taking the "negative" dummy bytes as a credit, which may be used later in the process. That is, if ΔM$_j$ is negative at j$^{th}$ block, then we don't insert any dummy bytes at this block. ΔM$_j$*j dummy bytes are saved as a credit (ΔM$_j$*j=−j, because ΔM$_j$=−1 always), and used to offset the positive dummy bytes in the following blocks. In other words, if later on in the (j+i)$^{th}$ block we need to insert ΔM$_{j+i}$*(j+i) positive dummy bytes (ΔM$_{j+i}$*(j+i)=j+i, because a positive ΔM$_{j+i}$ can only be 1 if there is a negative ΔM$_j$), then it is not necessary to insert the full amount (j+i) and instead only (j+i)−j=i dummy bytes need by inserted. This rule only applies to "decrease of D" cases where in the j$^{th}$ block, the number of dummy bytes to be inserted is ΔM$_j$*j. In the "increase of D" cases where in the j$^{th}$ block the number of dummy bytes is ΔM$_j$*(I−j), the above rule applies reversely from (I−1) block to the 1$^{st}$ block.

Figure 9:
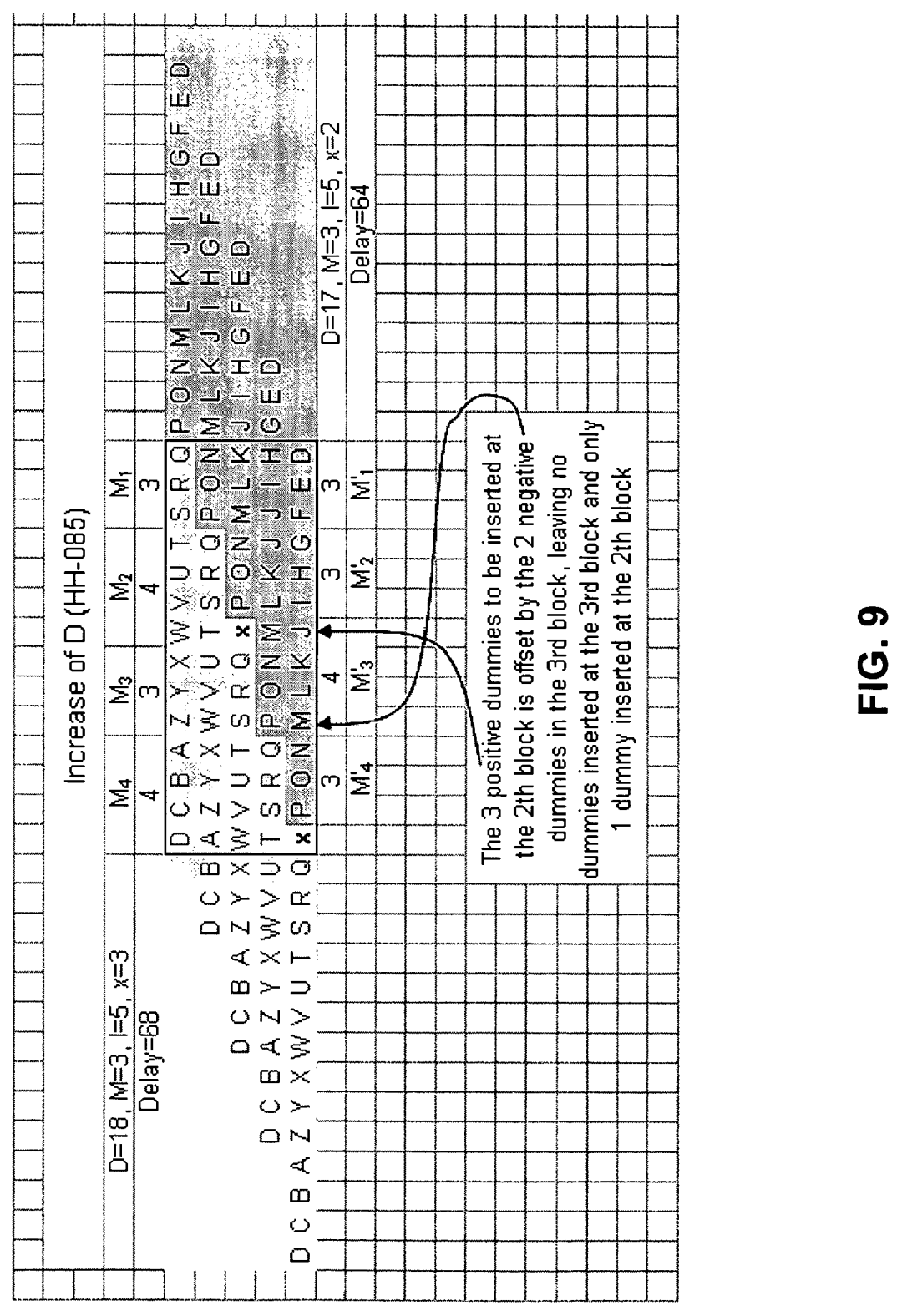
Figure 10:
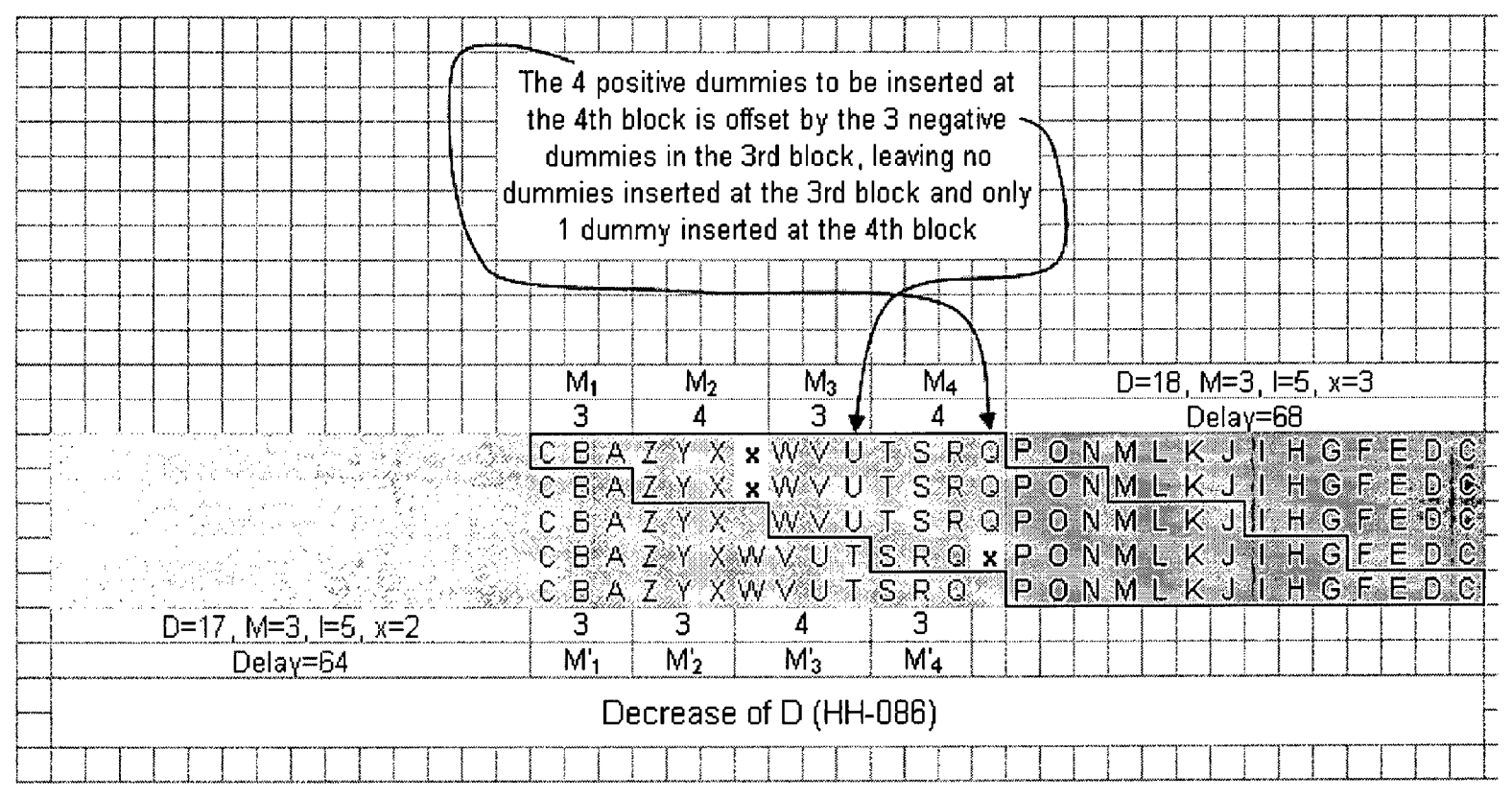
Figure 11:
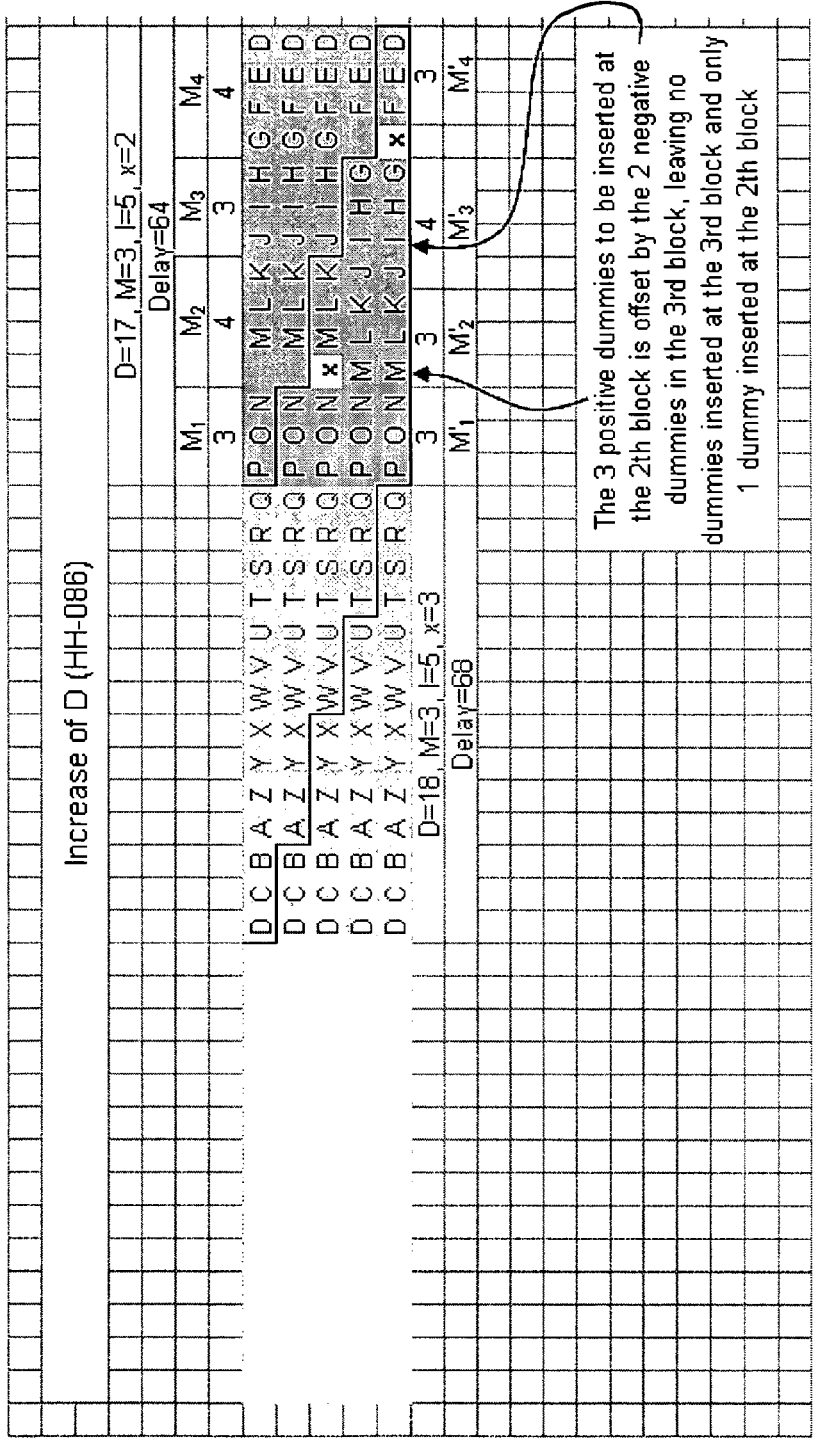
FIG. 11 is a data stream representation of an exemplary negative dummy byte insertion scenario for implementation with the third embodiment of the present invention.

FIGS. 8 through 11 illustrate examples of how the rule of negative ΔM$_j$ applies to different cases. In FIG. 8, the four positive dummy bytes to be inserted at the 4$^{th}$ block are offset by the three negative dummy bytes in the 3$^{rd}$ block thereby leaving no dummy bytes inserted in the 3$^{rd}$ block and only one dummy byte inserted at the 4$^{th}$ block. In FIG. 9, the three positive dummy bytes to be inserted at the 2$^{nd}$ block are offset by the two negative dummy bytes in the 3$^{rd}$ block, thereby leaving no dummy bytes at the 3$^{rd}$ clock and only one dummy byte inserted at the 2$^{nd}$ block. In FIG. 10, the four positive dummy bytes to be inserted at the 4$^{th}$ block are offset by the three negative dummy bytes in the 3$^{rd}$ block, thereby leaving no dummy bytes inserted at the 3$^{rd}$ block and only one dummy byte inserted at the 4$^{th}$ block. In FIG. 11, the three dummy bytes to be inserted at the 2$^{nd}$ block are offset by the two negative dummy bytes in the 3$^{rd}$ block, thereby leaving no dummy bytes inserted in the 3$^{rd}$ block and only one dummy byte inserted at the 2$^{nd}$ block.

Figure 12:
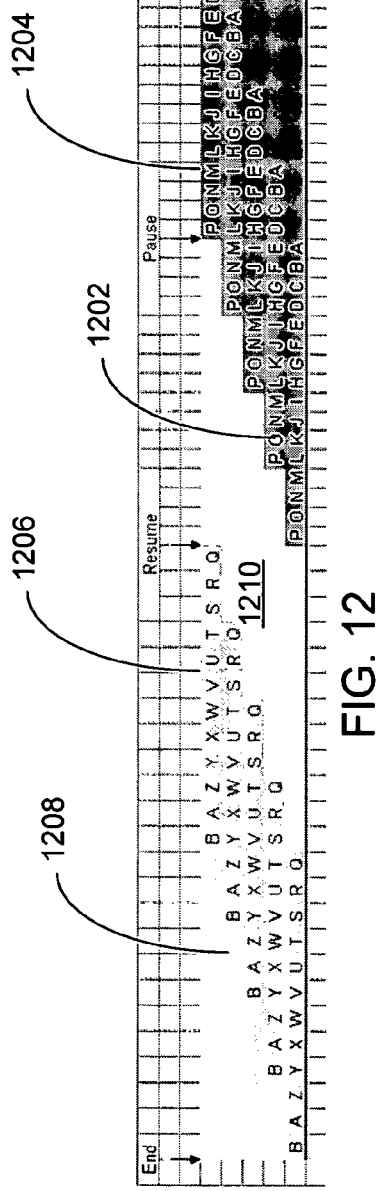
FIG. 12 is a data stream representation of an interleaver output stream: no overlapping and long gap.
Figure 13:
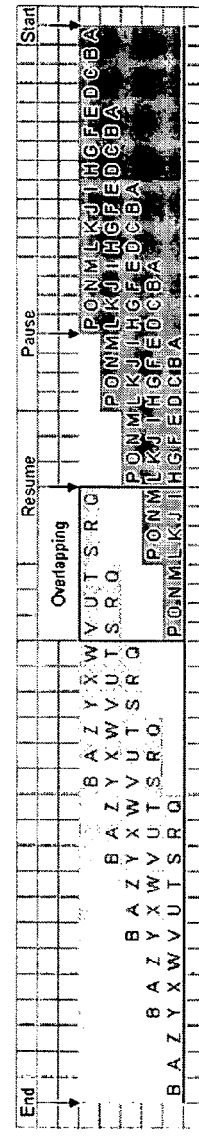
FIG. 13 is a data stream representation of an interleaver output stream: overlapping and shorter gap.
Figure 14:
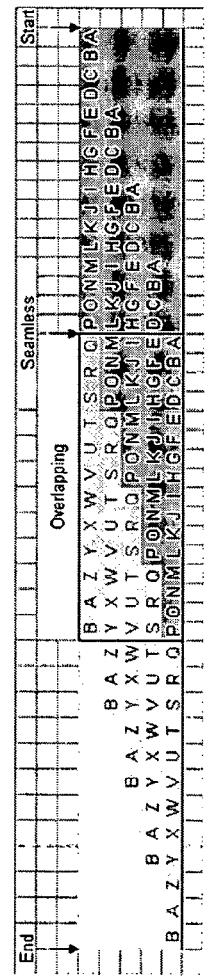
FIG. 14 is a data stream representation of an interleaver output stream: complete overlapping and no gap (seamless).

FIGS. 12 through 21 illustrate a dynamic interleaver design for seamless depth transition and for implementing the dummy byte insertion patterns for dynamic interleaver configuration for dummy insertion. To change the interleaver depth at run-time, a normal interleaver must stop the input data stream for a time equal to at least the interleaving delay so that the residue data in the interleaver buffer can be fully flushed. After that, the interleaver is changed to the new depth and the input stream is resumed. This "interleaver flush" process is illustrated in FIG. 12. The goal is to have the dynamic interleaver overlap the tail 1202 of the old interleaver output 1204 and the head 1206 of the new interleaver output 1208, so that the gap 1210 at the interleaver input stream can be reduced to zero resulting in a seamless transition, as shown in FIG. 14.

Figure 15:
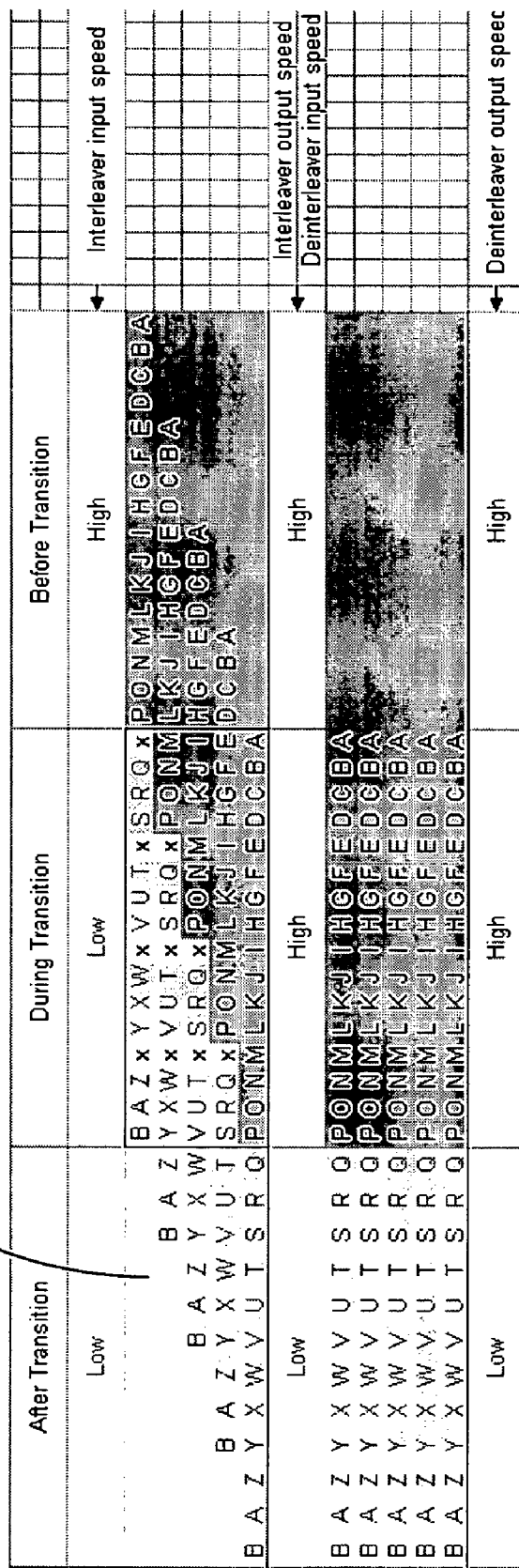
FIG. 15 is a data stream representation of an insert dummy bytes for the decreasing depth transition.
Figure 16:
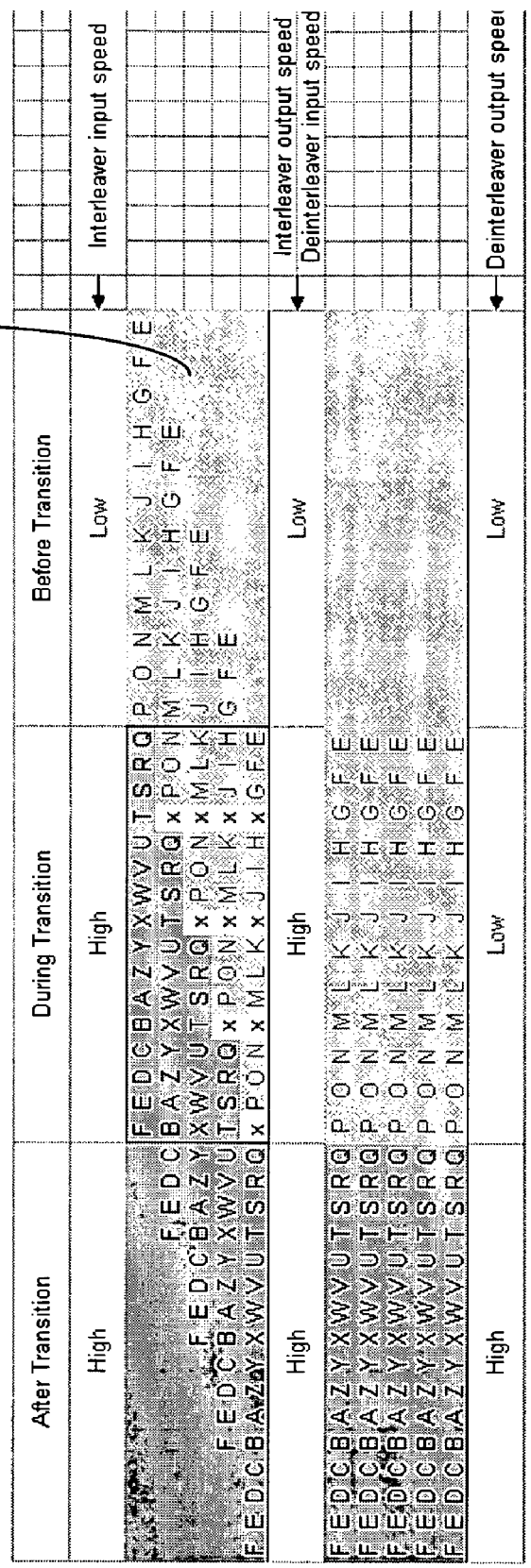
FIG. 16 is a data stream representation of an insert dummy bytes for the increasing depth transition.

During the transition period, as shown in FIGS. 15 and 16, dummy bytes are inserted to the lower-rate data stream 1502 and 1602, respectively, to accommodate the (de)interleaver input/output speed difference.

Figure 17:
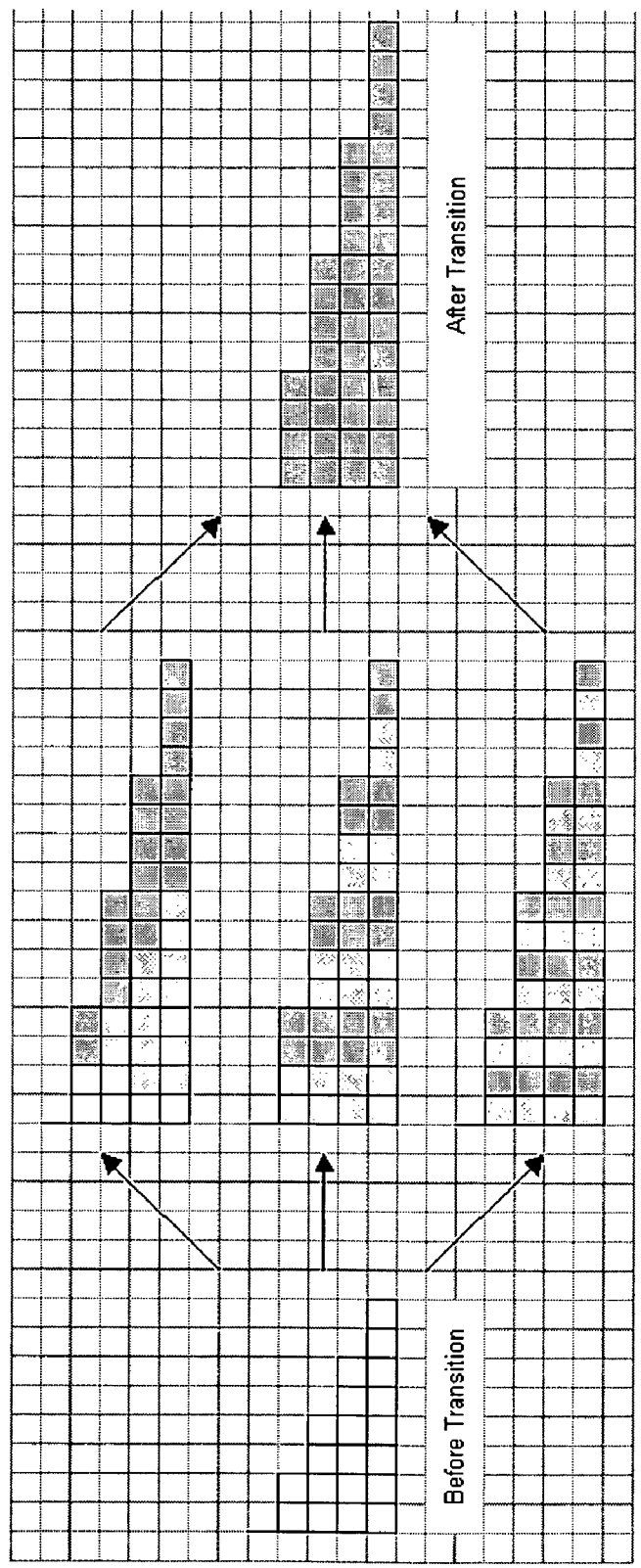
FIG. 17 is a data stream representation of changing the shape of the interleaver buffer.

Now with regard to three functions of dummy insertion, i.e., 1) changing the shape of the interleaver buffer to change the interleaving depth; 2) accommodating the (de)interleaver input/output rates to minimize the delay variations; and 3) maintaining or preserving the INP. The following addresses the function of the dummy insertion in changing the shape of the interleaver buffer to change the interleaver depth on-the-fly. From the implementation point of view, changing the interleaver depth is equivalent to changing the shape of the interleaver buffer. This change is accomplished by inserting the dummy bytes. There are many acceptable dummy insertion patterns. FIG. 17 shows just a few. For each delay line of the interleaver buffer, the total number of dummy bytes may be determined by the relative delay line length between the old and the new interleavers. This is common for all the dummy insertion patterns of FIG. 17. The difference is in how to insert the dummy bytes, i.e., in one chunk, distributed, or evenly distributed. The decision to choose one pattern over another greatly affects the implementation complexity and how we meet the delay variation and INP requirements.

Figure 18:
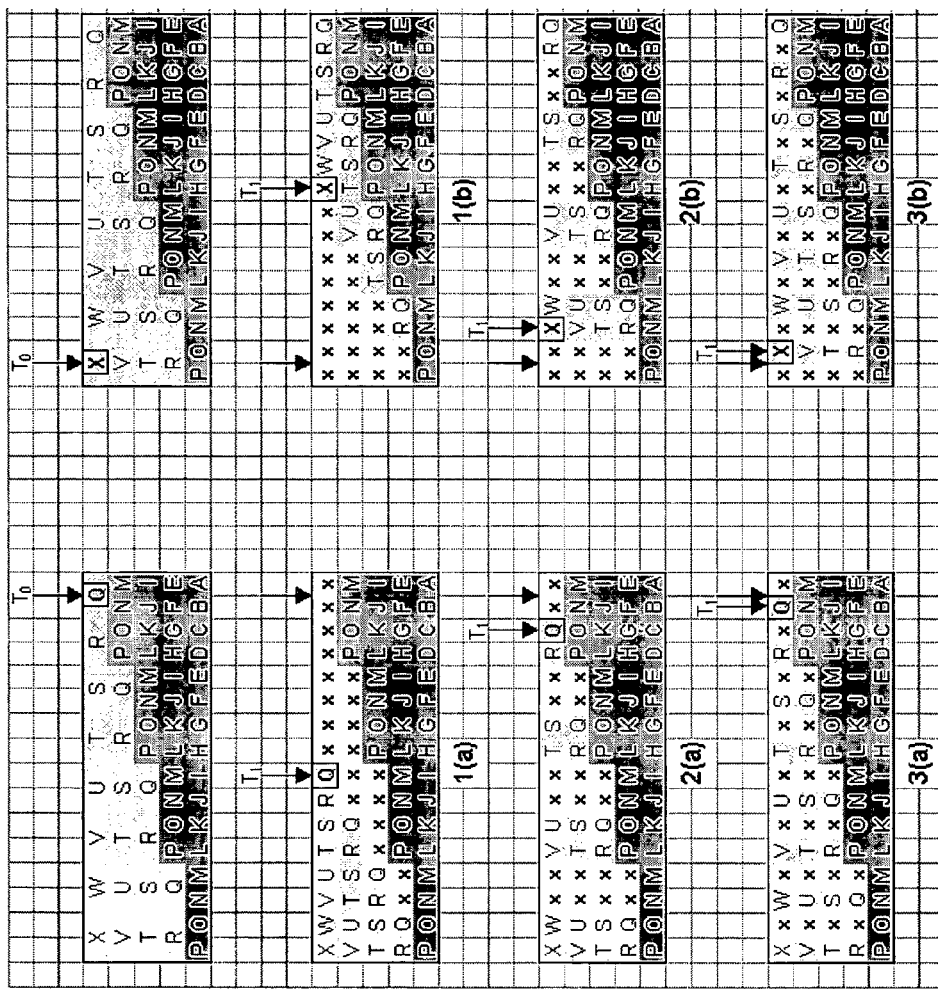
FIG. 18 is a data stream representation of different dummy insertion patterns (Decrease of D).

The following addresses the function of the dummy insertion in minimizing the delay variations. A perfect "seamless" transition should have zero delay variation and should be transparent to the upper layers, however this is not always necessary for real world applications. Certain dummy insertion patterns can minimize the delay variations. FIG. 18 illustrates six different dummy insertion patterns for decreasing depth transition. The dummy bytes x are all inserted into the data pool with lower input speed (the upper portion or triangle), referred to as "slow data." The data bytes with higher input speed (the lower portion or triangle) referred to as "fast data" are not affected by the dummy insertion so the "fast data" arrive at the deinterleaver as expected.

Patterns 1(a), 2(a), 3(a) of FIG. 18 send out dummy bytes first, and then send out the data bytes. Due to the dummy byte insertion, at the interleaver output the "slow data" are all delayed more than they should be. For example, the first "Q" byte should be sent out at time $T_0$, but is actually delayed to time $T_1$ ($0<T_1-T_0<$InterleaveDelay). When these delayed data arrive at the deinterleaver, due to the dummy byte removal, they are brought forward, which compensates the previously added delay. Overall, the dummy byte-affected "slow data" still exit from the deinterleaver on time so there is no delay variation.

Patterns 1(b), 2(b), and 3(b) of FIG. 18 send out data bytes first and then send out the dummy bytes. In these patterns, the "slow data" are all sent out earlier than expected, i.e., $T_1-T_0<0$. For some of the "slow data" (e.g., the data in the first row), this looks impossible because they are experiencing a negative delay (being sent out earlier than they are available). In real world application, a negative delay can be compensated by the existing positive delay (buffering) or it may become a positive delay when idle bytes are sent out at the time slots of the unavailable data. Either way, these dummy byte insertion patterns cannot achieve zero delay variation.

Based on the above discussion, patterns 1(a), 2(a), and 3(a) can achieve zero delay variation. Of the three patterns, 1(a) requires the most interleave memory while being the least complex, while 3(a) requires the least interleave memory while being the most complex.

Figure 19:
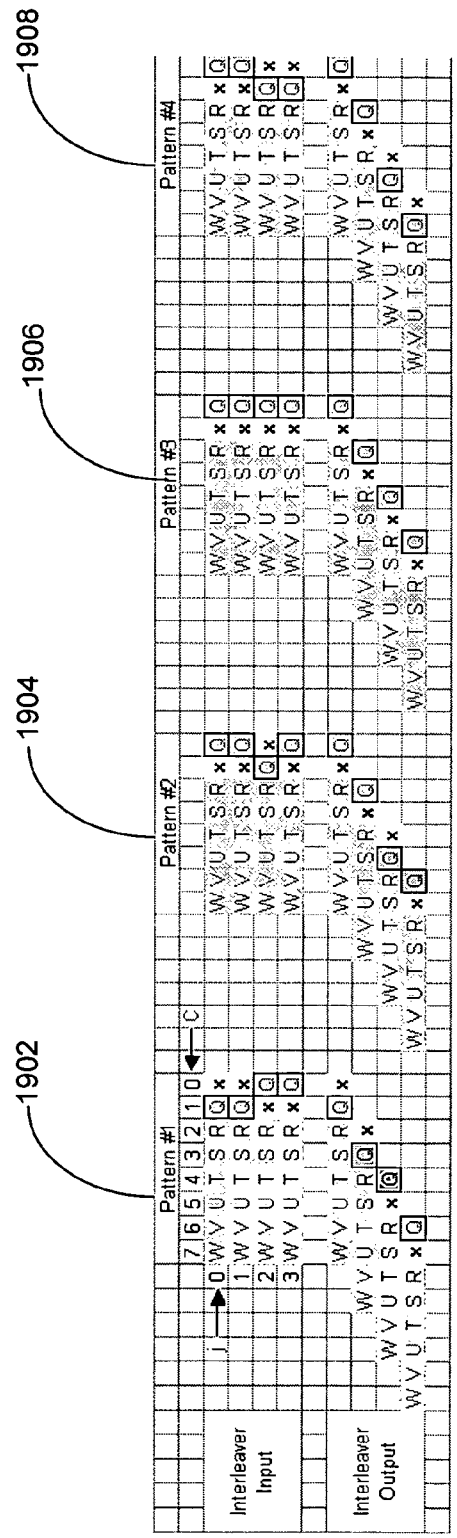
FIG. 19 is a data stream representation of condensed spreading affected by dummy bytes insertion.
Figure 20:
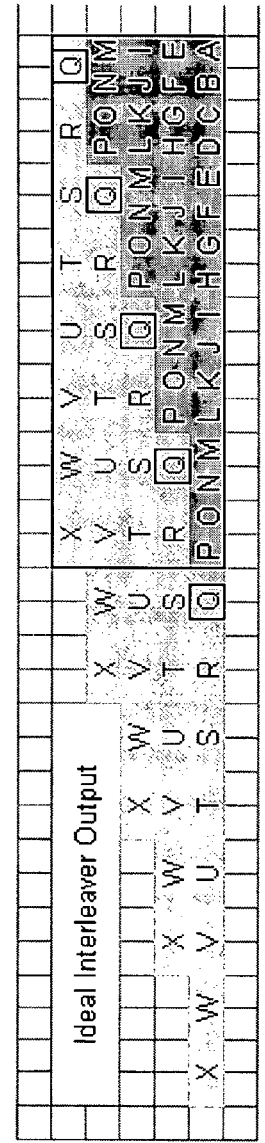
FIG. 20 is a data stream representation of ideal condensed spreading during transition.
Figure 21:
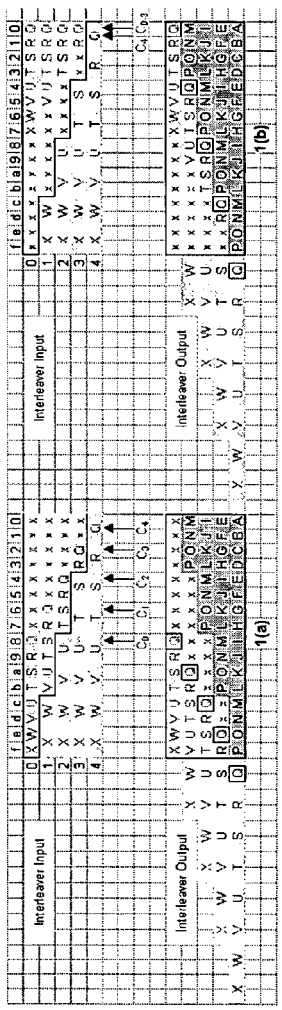
FIG. 21 is a data stream representation of condensed spreading due to dummy insertion.
Figure 21:
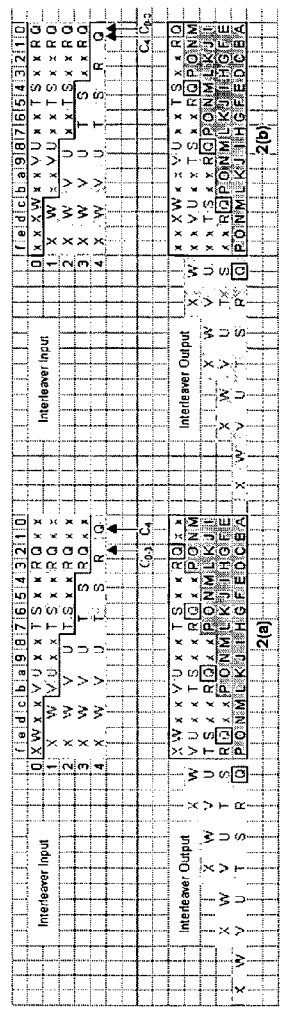
Figure 21:
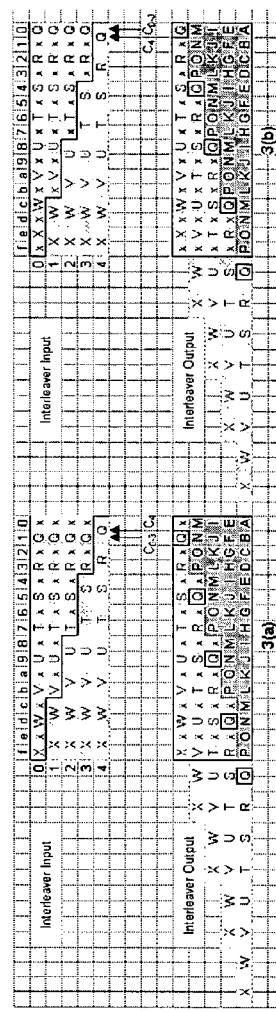

With reference to FIGS. 19-21, the following addresses the function of the dummy byte insertion in maintaining the INP. During the transition, the positions of the "slow data" are altered by the dummy byte insertion. This inevitably changes the spreading of the interleave codeword. The challenge to maintain the INP is to preserve the spreading of the dummy-affected "slow data" during the transition period. First, consider how to insert the dummy so as to preserve the spreading of the interleave codeword.

FIG. 19 illustrates four dummy byte insertion patterns 1-4 and how they affect the spreading of the "Q" codeword. From FIG. 19, it is clear that patterns #1 and #2, respectively 1902 and 1904, cause shortened distance of adjacent "Q" bytes, while #3 and #4, respectively 1906 and 1908, preserve the spreading of "Q." This is more clearly shown in the interleaver input stream (assuming the dummy bytes are inserted at the input)—if $C_j$ is the column number of the $j_{th}$ "Q" byte at the interleaver input stream, then as long as $C_j \geq C_{j-1}$, the spreading of the "Q" codeword is at least preserved or better.

Based on this guideline and with reference back to the dummy patterns in FIG. 18, the ideal codeword spreading is illustrated in FIG. 20 as a reference. The codeword spreading of the six patterns of FIG. 18 are illustrated in FIG. 21, which shows that only patterns 1(b), 2(b) and 3(b) can maintain the INP during the transition, while 1(a), 2(a) and 3(a) cannot.

In looking at the requirements from a standpoint of maintaining Quality of Service (QoS) during rate adaptation, based on the delay and INP equations of the GCI (Equations 6 and 7), both the delay and INP are inverse-proportional to the line rate. As the line rate changes, the quality of the data stream may be maintained by changing the interleaving depth in proportion to the line rate.

$$\text{Delay (ms)} = \frac{8 \cdot (D-1) \cdot (I-1)}{\text{LineRate (kb/s)}}; \quad (6)$$

$$\text{INP (ms)} = \frac{t}{q} \cdot \frac{8 \cdot D}{\text{LineRate (kb/s)}}; \quad (7)$$

$$> \frac{t}{q} \cdot \frac{8 \cdot (D-1)}{\text{LineRate (kb/s)}} = \text{INP\_LB}. \quad (8)$$

In more detail, during rate adaptation the system should both 1) keep the FEC parameters N and R unchanged, thus the Reed-Solomon coding gain would not change, and 2) keep the interleaving block size I unchanged. As the line rate changes, the interleaving depth (D−1) should change in proportion to the line rate. This makes the delay remain constant. Since N, R and I are unchanged, the parameters t and q (=N/I) are unchanged. To keep INP no less than INP_min for all possible rates, when selecting the initial FEC/interleaver parameters at the training stage, a degree of over-provisioning is needed to make INP_LB≧INP_min (Eq. 3). Because (D−1) is proportional to the line rate, INP_LB is constant as the line rate changes. This ensures the real INP (Eq. 2) will be larger than INP_min at any time.

Of interest in considering the inventive aspects discussed herein are alternative dynamic interleaver implementations such as described in: SI-090, "VDSL2—Error Free Rate Adaptation and Rate Repartitioning", Texas Instruments, Cory Modlin, Oct. 18-22, 2004, Stresa, Italy ("SI-090"); D.130, "G.VDSL: VDSL2 Seamless DRR Requirements", Alcatel Bell, Danny Van Bruyssel, Nov. 29-Dec. 3, 2004, Geneva ("D.130"); and D.131, "G.VDSL: VDSL2 Seamless DRR using a Dynamic Interleaver", Alcatel Bell, Danny Van Bruyssel, Nov. 29-Dec. 3, 2004, Geneva ("D.131").

SI-090 purports to disclose an "error free" interleaver adaptation method for SRA (Seamless on-line Rate Adaptation) and DRR (Dynamic Rate Repartitioning). The scheme is simple and does not require changes to the current interleavers. However, it does not ensure "seamless" adaptation of the interleaver in the sense of maintaining constant delay. According to SI-090 and D.130, true seamless on-line rate adaptation would mean no errors, no interruption in data, and no changes in delay and impulse noise protection (INP), both in the steady states and in the transient state. To achieve these on an interleaved latency path, a dynamic interleaver reconfiguration scheme is required to change the interleaving depth on the fly. In one aspect of the invention, a new dynamic interleaver reconfiguration scheme allows seamless on-line rate adaptation with finer control of the rate change and provides near-zero delay variation and preserves INP during the transition. SI-090 purports to provide an error-free rate adaptation method that requires that the transmitter pause the transmission. D.131 describes a dynamic triangular interleaver scheme that allows constant delay on average, but requires large additional memory during "decrease of M", and requires large delay variation during "increase of M".

The method of SI-090 describes pausing the data stream during the interleaver reconfiguration so as to allow the interleaver buffer to be fully flushed. However, interruption of the data stream is particularly undesirable for data services that are sensitive to "delay variations", e.g., constant bit rate (CBR) audio/video (A/V) streams. SI-090 purports to describe a transition process wherein the line rate is changed to ¾ of the original line rate and the interleaving depth is decreased accordingly. The data streams are observed at the interleaver input (transition state 1), interleaver output (transition state 2), and at the deinterleaver output (transition state 3) and are purported to result in the interleaving delay remaining the same after the transition. However, the method of SI-090 results in an interruption of the incoming data during the transition, for a time of at lease the interleaving delay, to flush the interleaver buffer. This interruption in data avoids the overlapping between the tail of the old interleaver and the head of the new interleaver and thus ensures the error-free transition to the new configuration.

A purported advantage of the SI-090 method is that it is very simple and does not require any changes to the interleaver. But the interruption in the data is very undesirable for audio/video streaming services. For streaming services, the pause in the data stream can be considered as a positive delay variation, and in the case of SI-090, this variation is as large as the interleaving delay. Because every rate adaptation causes an interruption, as more and more rate adaptation occurs (e.g., video channels switched on and off), the end-to-end delay could accumulate until it can not be recovered by the service application.

In the DRR case, when a user has two video channels subscribed then typically one video channel is always on (the "always-on channel") while the other video channel is switched on/off very often (the "intermittent channel"). If the DRR technique allows or causes an interruption of service then there is essentially no way to avoid the disturbance to the always-on channel. The reason for this is that every interleaver transformation contributes positive delay variation to the always-on channel. As more and more "on/off" events (therefore more and more DRR events) occur on the intermittent channel, more and more buffering is required until eventually virtually unlimited buffering for the always-on channel is required to compensate for the interruption of the stream. SI-090 is purportedly error free, but it does not provide "seamless" transition in that it does not provide a zero delay variation. Accordingly, for "seamless" adaptation of CBR traffic, zero delay variation is desired.

Turning attention now to D.131, which purports to describe a dynamic interleaver scheme to achieve zero delay variation during DRR. However, in the method of D.131 the adaptation scheme requires extra memory during interleaver transformation. To eliminate interruption during interleaver transformation, the tail of the old interleaver and the head of the new interleaver should be overlapped. During the transition, the interleaver output speed (equal to the line rate) should be kept at the higher speed of the two rates (before and after transition). Dummy bytes are inserted to compensate for the speed difference and to shape the interleaver and the deinterleaver. D.131 illustrates the data streams at the following successive stages: interleaver input (1), after dummy insertion (2), followed by interleaver output (3), and finally deinterleaver output (4). As described, the line rate is changed to ¾ of the original line rate and the triangular interleaver is changed from $M_1=4$ to $M_2=3$, with interleaving block length I equal to 5.

According to D.131, it takes $Max(M1,M2)*I*(I-1)$ bytes to finish the interleaver transformation. During the whole transformation process, $\Delta M*I*(I-1)/2$ dummy bytes ($\Delta M=M_1-M_2$) are inserted at the interleaver, and the same amount of dummy bytes, or "dummy bytes," are removed from the deinterleaver. The transition process is synchronized between the interleaver and the deinterleaver. The dummy bytes are inserted and removed in a pre-defined pattern so that the interleaver and the deinterleaver can be transformed to the new shape as expected. When $\Delta M>1$, the whole transition process can be performed as multiple $\Delta M=1$ transitions.

In considering D.131 one must address certain drawbacks, for instance during dummy insertion impulse noise protection (INP) is impaired. During the "decrease of M" transition additional memory is needed to buffer the incoming data at the interleaver. According to D.131, the dummy bytes may not be physically present in the interleaver memory and during the transition the interleaver output speed is higher than the input speed. At the beginning of the transition, most of the outputs are dummy bytes. According to this method, a relatively minor amount of real data is consumed inside the interleaver buffer, while the inputs keep coming. At this stage of the process the interleaver buffer grows, though in the long run the buffer size is decreased.

D.131 describes the process in terms of interleaver buffer draining speed vs. filling speed during the "decrease of M" transition. The filling speed (interleaver input speed) is constant during the whole transition period, which is $(M-1)/M$ of the output speed (in $\Delta M=1$ case). The buffer draining speed (interleaver output speed minus the dummy insertion speed) is characterized by a "slow start" behavior and reaches full output speed until all the dummy bytes are transmitted. D.131 requires additional memory, which in the worst case is $I*(I-1)/2$ bytes.

According to D.131, during the "increase of M" transition a positive delay variation as large as $I*(I-1)$ bytes could occur at the deinterleaver output. As described, for a given interleaving codeword, during the transition the first $(I-1)$ bytes of the codeword arrive at the deinterleaver output on time. The last byte of the codeword is delayed by $I*(I-1)$ bytes. At the Reed-Solomon decoder output, the whole codeword is delayed by $I*(I-1)$ bytes because the decoding cannot output a single byte until the whole codeword is collected. Further, the delayed byte of the codeword also blocks the following codeword. To compensate for this positive delay variation, "pre-buffering" of size $I*(I-1)$ bytes is needed at the receiver side.

D.131 describes a dynamic triangular interleaver scheme in terms of an "increase of M from 3 to 4." During the "decrease of M" transition, the dummy insertion causes impairment to the impulse noise protection. By definition of the convolutional interleaver: for adjacent bytes within an interleaving block (of size I), their distance should be D after interleaving. During the transition period of D.131, since the line rate is at the higher rate "Rate1", in order to maintain the same INP the distance of adjacent bytes within an interleaving block should be at least $D1=M1*I+1$. However, due to the dummy insertion the distance is shortened to $D2=M2*I+1$, which means the INP is dropped to $D2/D1$ of the original. One disadvantage leading to INP impairment is the insertion of the dummy bytes at the same time and at the end of each delay line. D.131 is purports to be error free and to provide "seamless" transition in that it does not provide a zero delay variation. However, D.131 requires extra memory during transition, is complex to implement, and is applicable on triangular interleaver.

According to one aspect of the present invention, INP may be preserved throughout transition by spreading the dummy bytes more evenly and not always at the end of each delay line.

Figure 22:
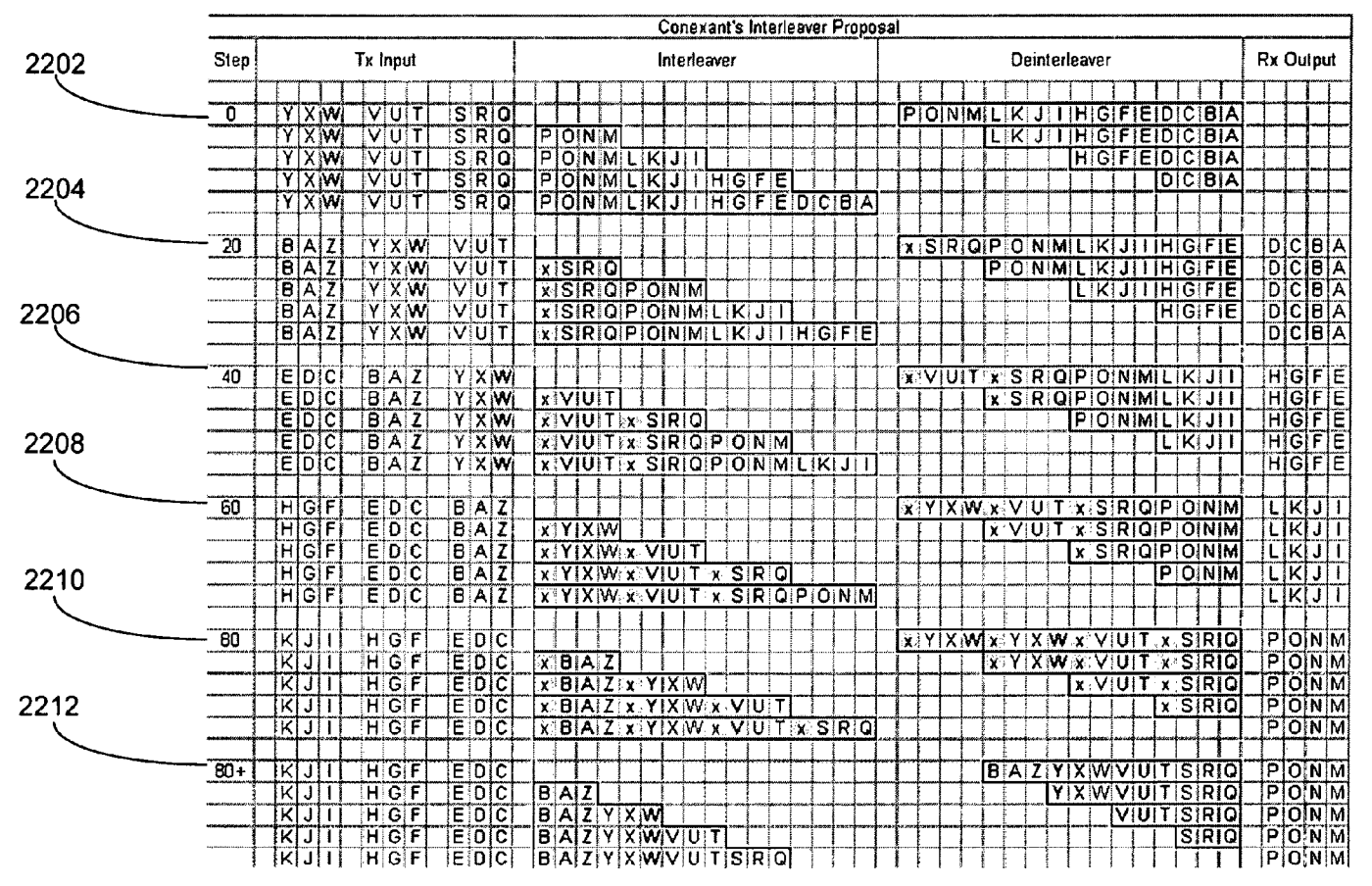

With reference to FIG. 22, in one embodiment the present invention provides a dynamic interleaver adaptation scheme wherein a constant delay is maintained by adapting the interleaving depth parameter M proportional with the rate. This approach is based on a triangular interleaver or general convolutional interleaver ("GCI") with x=1. FIG. 22 shows the step-by-step behavior of the new interleaver scheme when M is changed from $M_1=4$ to $M_2=3$, with interleaving block length I equal to 5 using the triangular interleaver (or GCI with x=1). This approach can be expanded to GCI as well, e.g., for use in VDSL2.

FIG. 22 illustrates an exemplary embodiment of the interleaver adaptation scheme for seamless DRR. The interleaver adaptation begins at Step (0) 2202 and ends at Step (80) 2212. At Step (0) 2202, no dummy bytes are needed to shape the interleaver. As described in this exemplary embodiment, it takes, for example, $M_1*I*(I-1)$ steps to finish the transformation. Starting from Step (0), the interleaver input speed is switched to the new rate of $M_2/M_1$ (or simply ¾) of the original. The interleaver output speed, the line rate, and the deinterleaver input/output speed are not changed until the transformation is completed at Step (80). Dummy bytes x are generated naturally due to the input/output speed difference. The dummy bytes x at interleaver and deinterleaver are effectively "removed" simultaneously at the end of the transformation (Step 80). Removing the dummy bytes does not necessarily mean that they are physically extricated from the delay line, but may also mean that the dummy bytes are simply ignored by skipping the read/write pointers at their locations. Accordingly, the "increase of M" case can be implemented as follows. Before the "increase of M" adaptation starts, the dummy bytes may be pre-allocated in the delay line with pointers skipping them over. After the adaptation the dummy "holes" are filled.

In accordance with this exemplary embodiment of the invention, no extra memory is required to shape the interleaver. Further, this sheme simplifies implementation for interleavers using circular buffer (RAM) based delay lines. Although this approach uses a non-linear increment of the read/write pointers, the pointer increment is in an orderly fashion, e.g., every $M_1$ bytes, skipping the last $\Delta M$ bytes.

This exemplary embodiment of the present invention is error free, provides "seamless" transition in that it does provide a zero delay variation, does not require extra memory during transition, is not complex to implement, and is applicable on either triangular or GCI interleavers.

Now referring to FIGS. 24 through 27 in describing a second embodiment of the present invention which provides a dynamic interleaver configuration that maintains constant delay during transition. The dynamic interleaver of the second embodiment of the invention provides an optimized dummy insertion pattern that resolves the drawbacks of D.131 and can be extended to the generalized convolutional interleaver (GCI).

Figure 24:
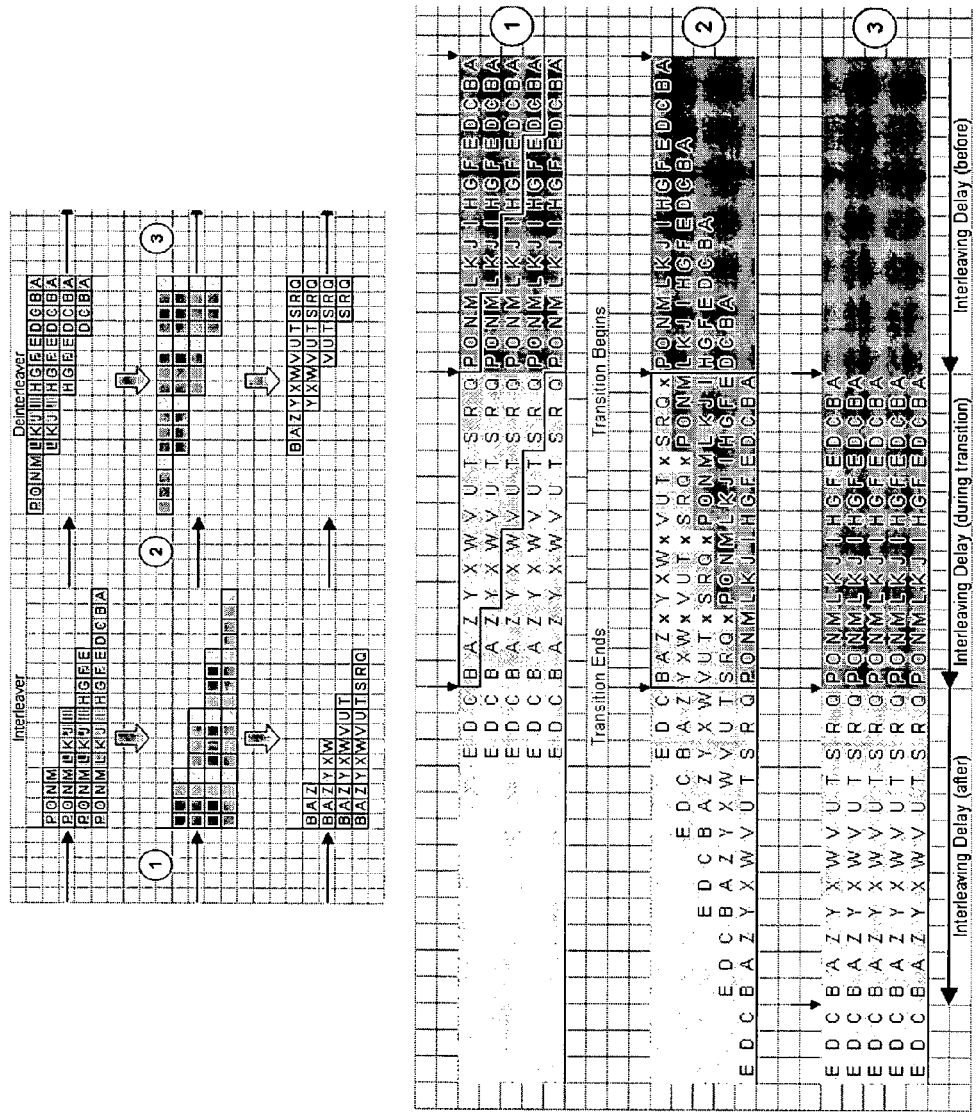
FIG. 24 is a data stream representation of a second embodiment of the present invention dynamic interleaver configuration scheme (triangular, decrease of M from 4 to 3).
Figure 25:
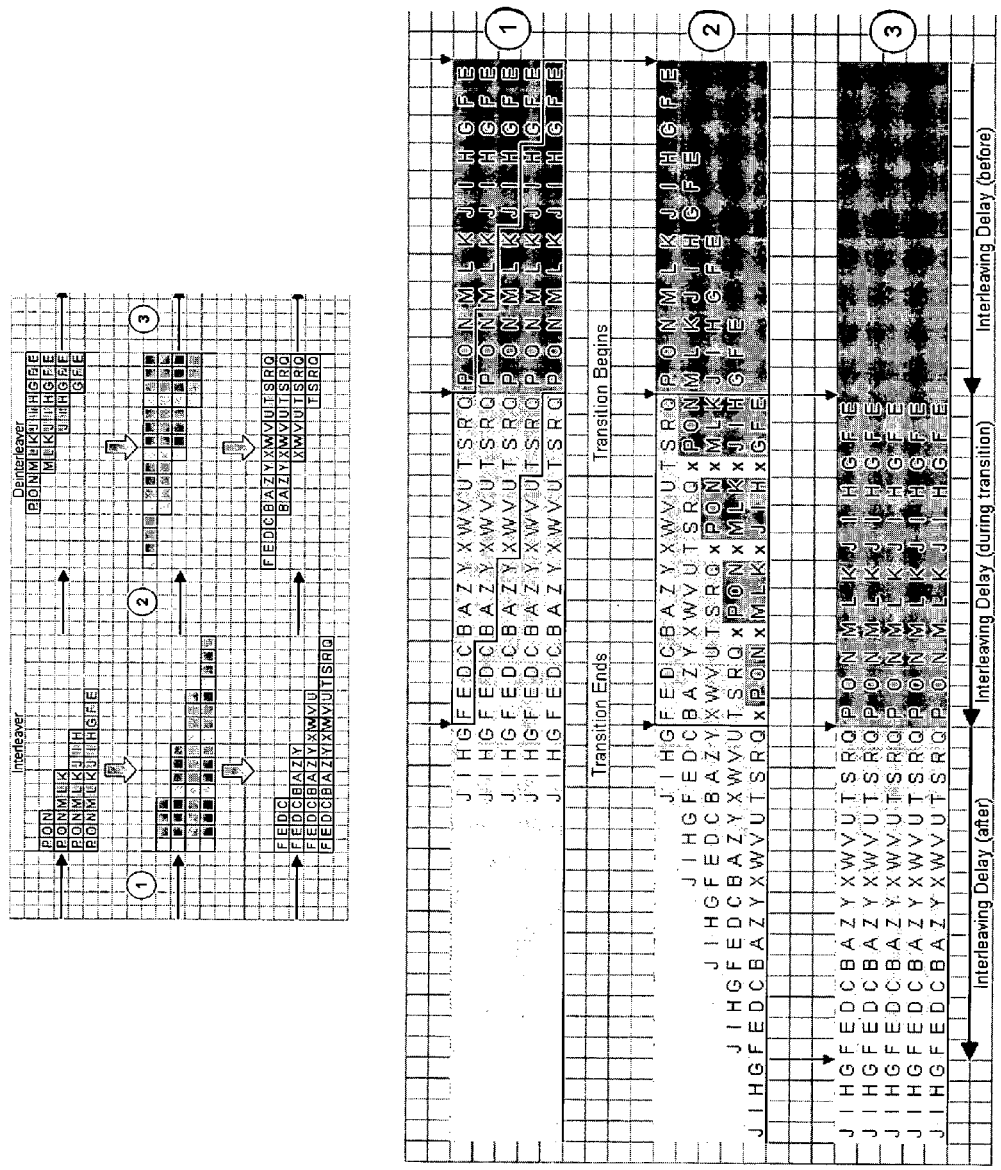
FIG. 25 is a data stream representation related to the second embodiment dynamic interleaver configuration scheme (triangular, increase of M from 3 to 4).

FIGS. 24 and 25 respectively show how the "decrease of M" and "increase of M" interleaver transformation are performed using the invention. The dummy bytes x are inserted as illustrated in the figures and as described as follows. FIG. 24 illustrates the "decrease of M" transition in which for each delay line $\Delta M$ ($\Delta M=M1-M2$) dummy bytes are inserted at the beginning of every M outgoing bytes. FIG. 25 illustrates the "increase of M" transition in which for each delay line $\Delta M$ dummy bytes are inserted at the end of every M outgoing bytes. Since the dummy bytes are inserted more evenly, the issues of D.131 are resolved. For instance, during "decrease of M" transition the additional memory issue is resolved. Only at the first delay line is an additional buffer of M bytes needed. Also, during "increase of M" transition no positive delay variation occurs at the deinterleaver output.

Figure 26:
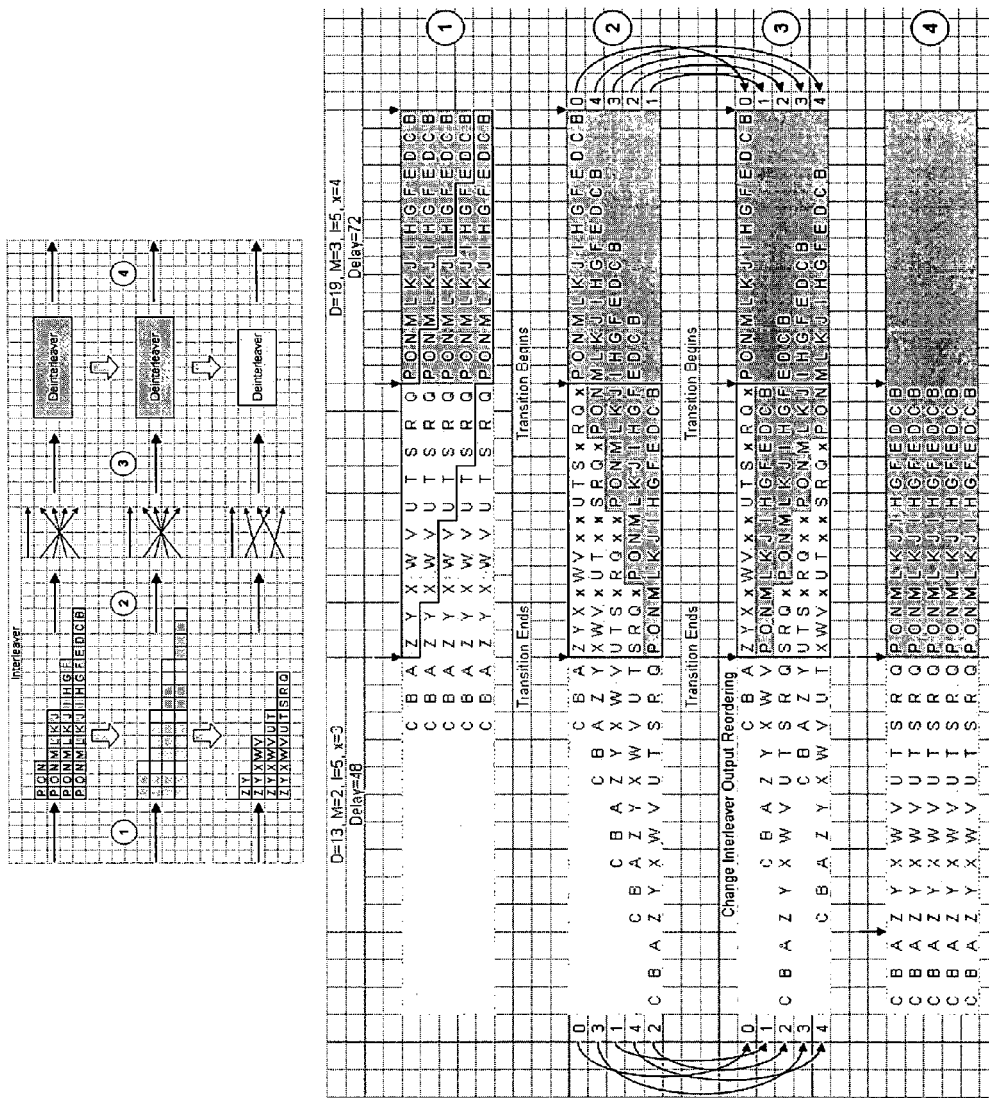
FIG. 26 is a data stream representation related to the second embodiment dynamic interleaver configuration scheme (GCI, decrease of D from 19 to 13).
Figure 27:
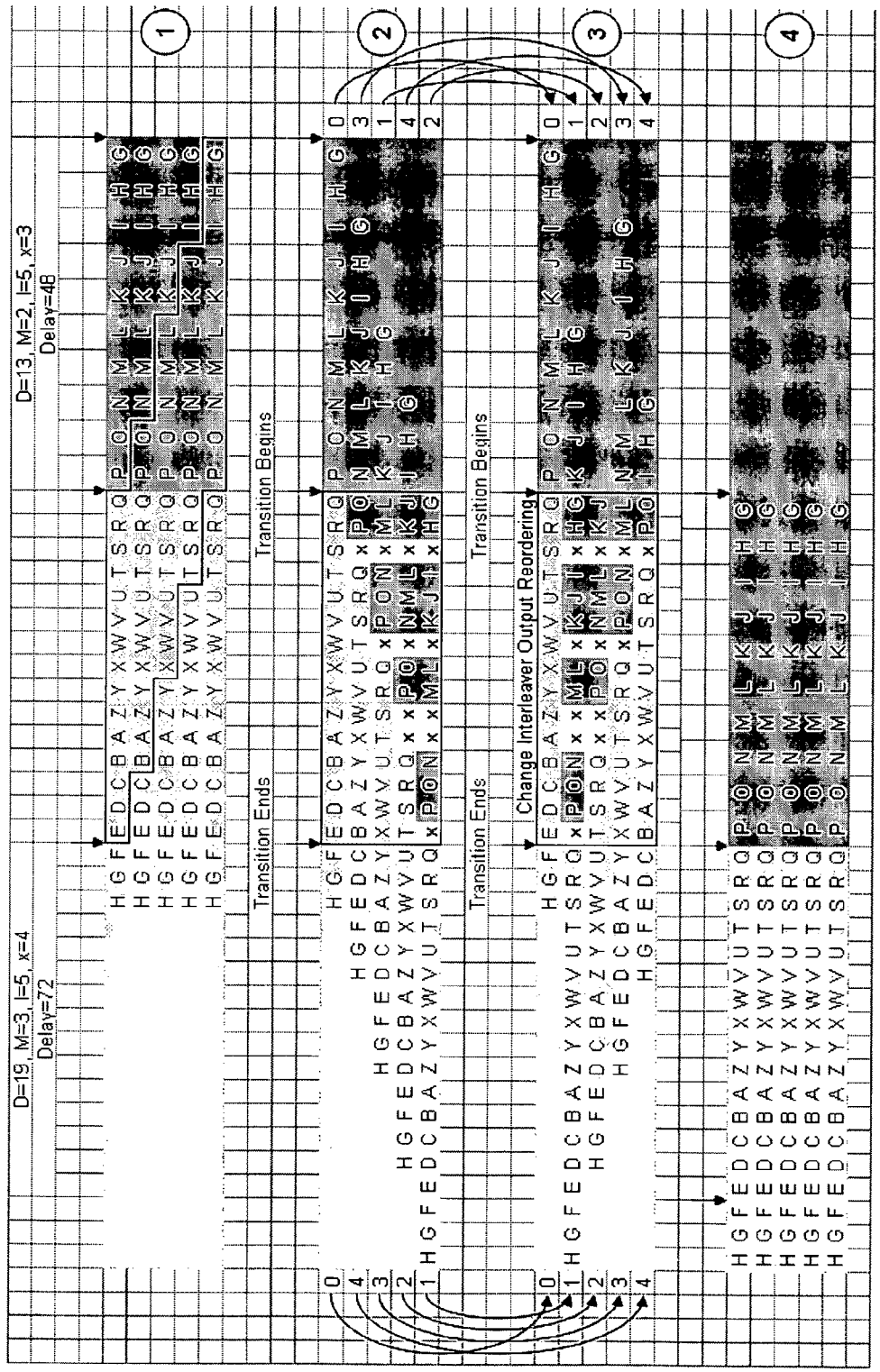
FIG. 27 is a data stream representation related to the second embodiment dynamic interleaver configuration scheme (GCI, increase of D from 13 to 19).

Although this embodiment of the invention has been described in terms of a triangular interleaver, it may also be extended to a GCI. With finer granularity of interleaving depth, the GCI allows finer control of the rate adaptation. In this respect, it may be more effective to have the dynamic interleaver scheme extended to GCI. The implementation of GCI is similar to the triangular interleaver in that it can be implemented using a near triangular buffer structure with a reordered output. FIGS. 26 and 27 show how the dynamic interleaver scheme is applied to GCI when the interleaving depth D is changed between 19 and 13.

The whole transition takes $\text{Ceil}((D-1)*(I-1)/I)*I$ bytes, where D is the larger of D1 and D2. The duration is not exactly equal to the interleaving delay. It is the interleaving delay $(D-1)*(I-1)$ rounded up to the next multiple of I. In this way, the beginning and the ending of the transition are still aligned with the interleaving codeword boundary.

The dummy insertion strategy is similar to that in the triangular case. If we consider the triangular interleaver as a stairway, then there are (I-1) steps and the width of each step is constant, i.e., always M. For each step, we need to insert $\Delta M$ dummy bytes to transform the triangular structure from M1 to M2. In the case of GCI, the interleaver is a near triangular stairway that the width of the $j^{th}$ step is $M_j$ (j=1, 2, ..., I-1), which is not constant. To transform the GCI structure from $M1_j$ to $M2_j$, the number of dummy bytes for each step $\Delta M_j$ is not constant either. At the beginning of the transition, the interleaver input speed is switched from "Rate1" to "Rate2". During the transition, the interleaver output speed (or the line rate) should be kept at the higher speed of "Rate1" and "Rate2", and the interleaving depth D is also kept as the larger of D1 and D2. In other words, in the "decrease of D" transition, the interleaver output speed (line rate) and the interleaving depth are changed at the end of the transition and, therefore, the end of the "decrease of D" transition should be aligned with the DMT symbol boundary. Further, in the "increase of D" transition, the interleaver output speed and the interleaving depth are changed at the beginning of the transition and, therefore, the beginning of the "increase of D" transition should be aligned with the DMT symbol boundary.

It is easy to see that the dynamic triangular scheme is a special case of the dynamic GCI scheme when D=M*I+1. For non-triangular GCI (D=M*I+x and x≠1), because the duration of the transition is $(D-1)*(I-1)$ rounded up to the next multiple of I, which is not exactly equal to the interleaving delay, there might be a worst-case delay variation of (I-1) bytes at the α-β interface. This delay variation is relatively small when compared to the variations generated by the other parts of the network, so it can be easily compensated. We still consider it as "near zero" delay variation, as defined in D.130.

It should be well understood, and the invention fully contemplates, that the exemplary embodiments described herein are for illustration purposes only and are not limiting and that different interleaver implementations may be used. One critical difference between D.131 and the above described dynamic interleaver dummy byte insertion configuration is the way that the dummy bytes are inserted during the transition. During interleaver transformation, the dummy insertion has two functions. First, to morph the interleaver to the desired shape, thus the interleaving depth D is changed. To maintain constant delay, a sudden change of D is not feasible because it causes an interruption of the data. In the other two algorithms, the dummy bytes are inserted to change the length of each delay line. For each delay line, the total number of inserted dummy bytes is same in both schemes but with different patterns. In D.131, the dummy bytes are grouped together, while in the above described embodiment of the present invention they are distributed more evenly. However, they both fulfill the function of shaping the interleaver. The second function of dummy byte insertion is to minimize the delay variation during the transition, because one desirable goal is "seamlessness." This function requires that:

(1) at the interleaver output, the dummy bytes should be transmitted evenly among the outgoing data (it is recognized that "perfectly" even is unrealistic and would require a very sophisticated scheme); and (2) at the interleaver input, the incoming data should not be rejected or delayed. From the foregoing analysis, we see that this function is not fulfilled by D.131 at least because it causes a large delay variation and that the present invention provides these two functions. Although the present dummy insertion methods and systems of FIGS. 2-27 distribute the dummy bytes more evenly than D.131, they do not ensure that the INP is "perfectly" preserved during GCI transition. However, when the interleaver is triangular then INP is preserved. In other words, the distance of the adjacent bytes within an interleaving block (of size I) is not a constant D during the transition. Though the average adjacent distance is D, some of the distance could be shortened to $D-2*I$ (when M is large) or I (when M is small) in the worst case. Accordingly, the worst-case impact to the INP is approximately $2*I/D$ in percentage drop when M is relatively big, or $1/(t+1)$ when M is small. If the requirement that transient period $INP(t)>=INP\_min$ could be relaxed (the argument here is the transient time is short enough that the INP impairment during this period is negligible), then this scheme is acceptable and prevails over the other schemes on most of the aspects. The dummy insertion methods and systems embodiments of the invention provide an effective dummy byte insertion scheme for applications that require seamless on-line rate changes, e.g., SRA (seamless rate adaptation), DRR (dynamic rate repartitioning) and adaptive INP (impulse noise protection).

Now referring to FIGS. 28 through 31 in describing a third embodiment of the present invention which provides a dynamic interleaver configuration that maintains constant delay during transition. The dynamic interleaver of the third embodiment of the invention provides an optimized dummy insertion pattern that resolves the drawbacks of D.131 and can be extended to the generalized convolutional interleaver (GCI). The embodiment allows seamless on-line rate adaptation and dynamic rate repartitioning on an interleaved latency path, with near-zero delay variation and finer control of the rate change. This embodiment also preserves INP value during the transition phase with any GCI.

Figure 28:
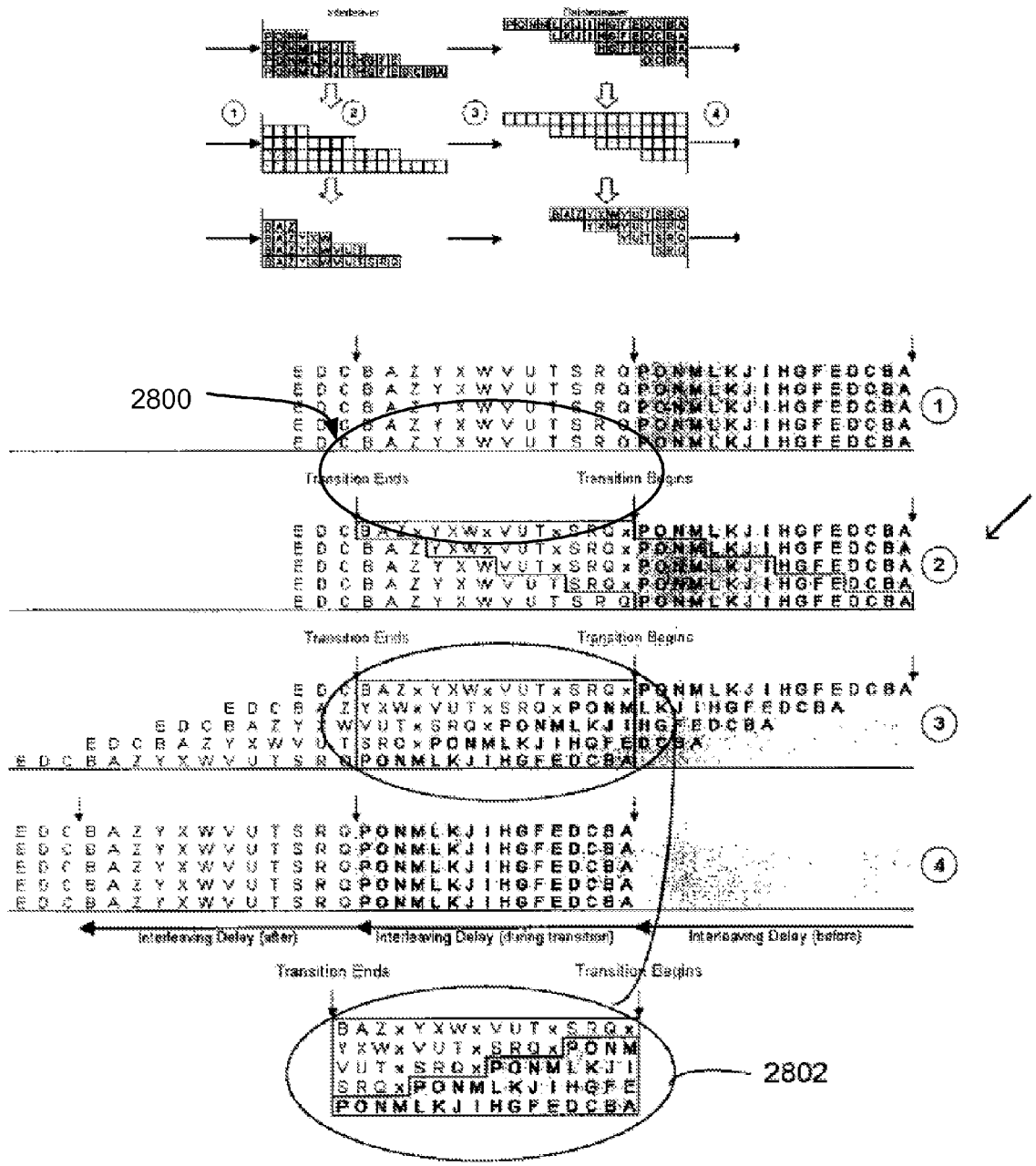
FIG. 28 is a data stream representation of a third embodiment of the present invention dynamic interleaver configuration scheme (triangular, decrease of M from 3 to 4).
Figure 29:
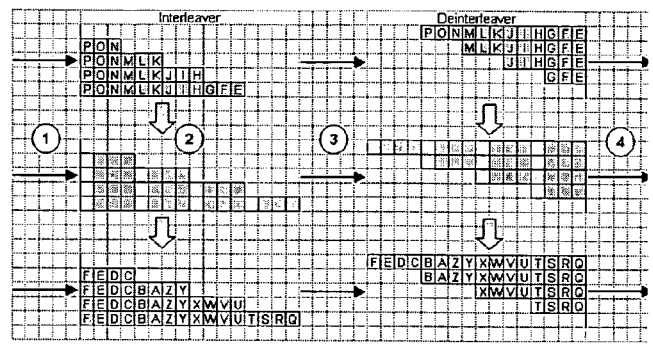
FIG. 29 is a data stream representation related to the third embodiment dynamic interleaver configuration scheme (triangular, increase of M from 3 to 4).
Figure 29:
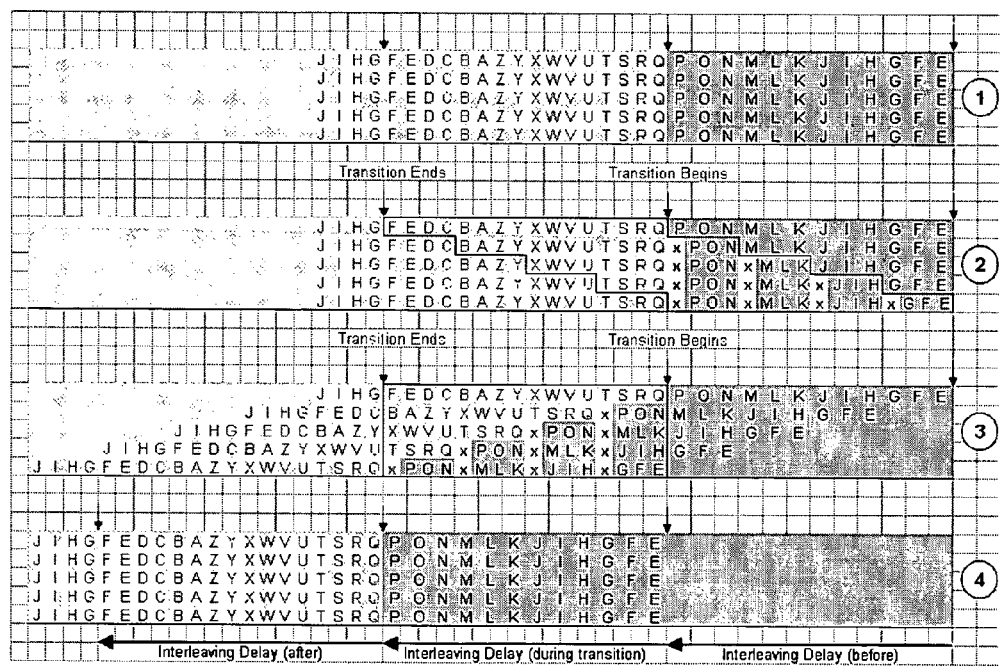
Figure 30:
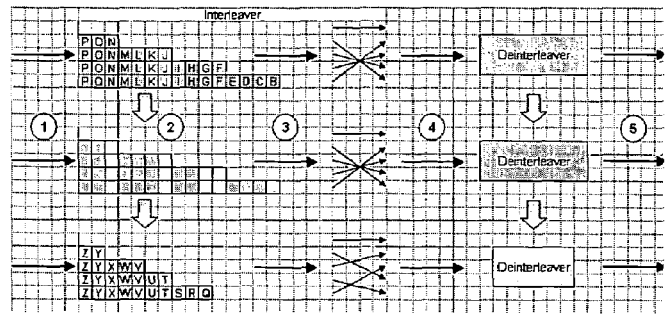
FIG. 30 is a data stream representation related to the third embodiment dynamic interleaver configuration scheme (GCI, decrease of D from 19 to 13).
Figure 30:
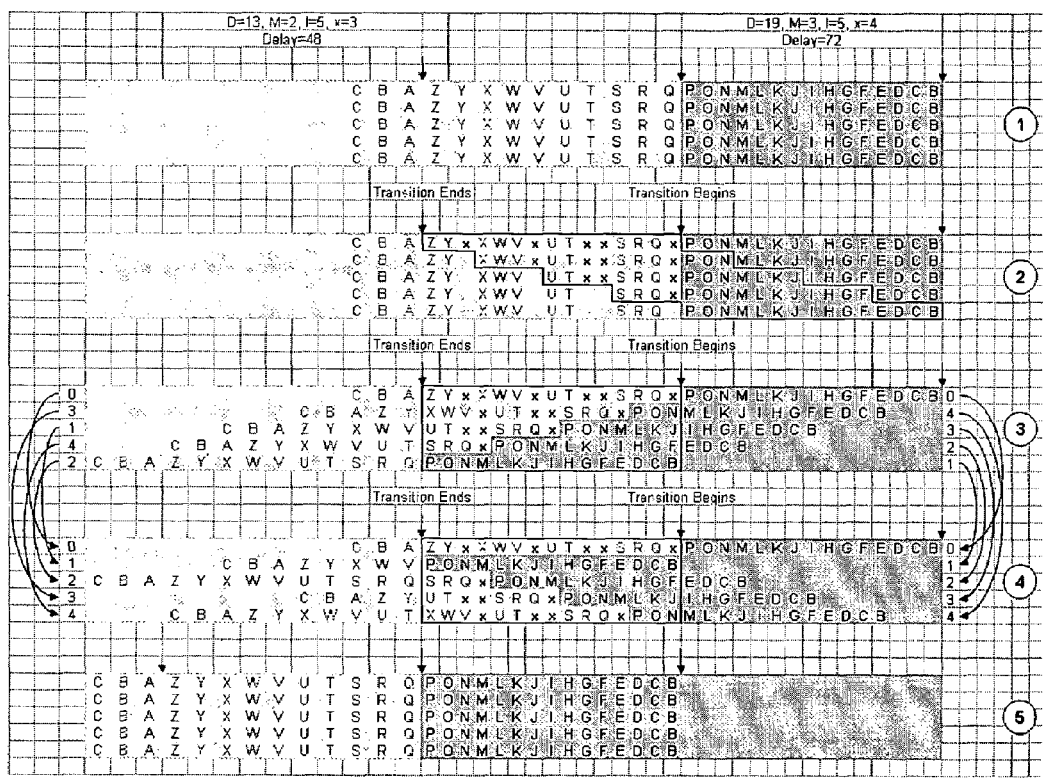
Figure 31:
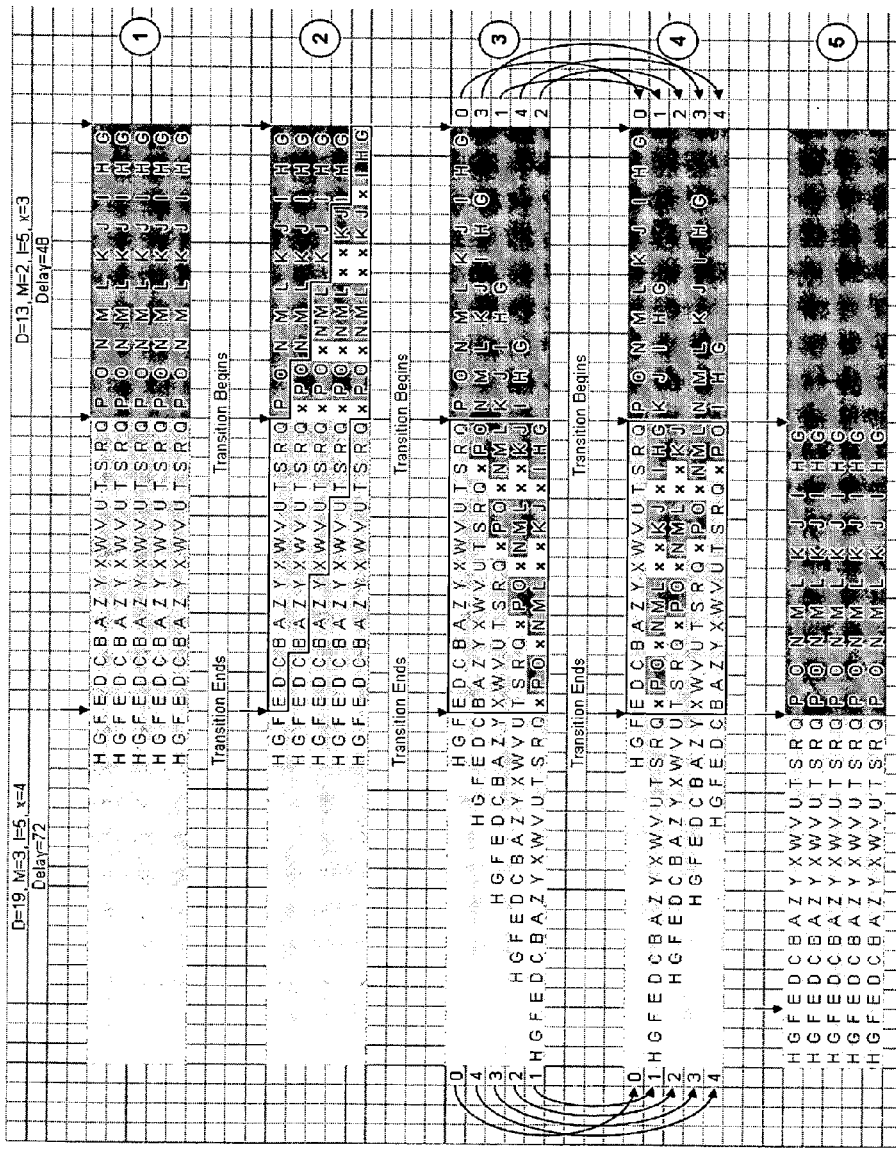
FIG. 31 is a data stream representation related to the third embodiment dynamic interleaver configuration scheme (GCI, increase of D from 13 to 19).

FIGS. 28 and 29 respectively show how the "decrease of M" (in this example from 4 to 3) and "increase of M" (in this example from 3 to 4) interleaver transformation are performed using this embodiment of the invention. FIGS. 28 and 29 illustrate the use of this embodiment of the invention in a triangular interleaver whereas FIGS. 30 and 31 illustrate the use of this embodiment in a GCI. The dummy bytes x are inserted as illustrated in the figures and as described as follows. FIG. 28 illustrates the "decrease of M" transition 2800 in which for each delay line $\Delta M$ ($\Delta M=M1-M2$) dummy bytes are inserted at the beginning of every M outgoing bytes. FIG. 29 illustrates the "increase of M" transition in which for each delay line $\Delta M$ dummy bytes are inserted at the end of every M outgoing bytes. Since the dummy bytes are inserted more evenly, the issues of D.131 are resolved. For instance, during the "decrease of M" transition of FIG. 28, the additional memory issue is resolved. Only at the first delay line is an additional buffer of M bytes needed. During the "increase of M" transition of FIG. 29, no positive delay variation occurs at the deinterleaver output. As can be seen in the highlighted transition 2802 of FIG. 28, INP is not impaired at all, i.e., the distance of adjacent "P" bytes remains 21. The dynamic interleaver configuration of FIG. 28 illustrates the example of a decrease of M from 4 to 3 and the configuration of FIG. 29 illustrates the example of an increase of M from 3 to 4.

Now referring to FIGS. 30 and 31, with finer granularity of interleaving depth, the dynamic interleaver configurations extended to GCI allows finer control of rate adaptation and results in a more effective scheme. The implementation of GCI is similar to that of triangular interleaver in that it can be implemented using a near triangular buffer structure with a reordered output. FIGS. 30 and 31 illustrate in exemplary fashion how the dynamic interleaver scheme may be applied to GCI when the interleaving depth D is changed between 19 and 13. FIG. 30 illustrates a decrease in D from 19 to 13 while FIG. 31 illustrates an increase in D from 13 to 19. The whole transition takes $Ceil((D-1)*(I-1)/I)*I$ bytes, where D is the larger of D1 and D2. The duration is not exactly equal to the interleaving delay, but is the interleaving delay $(D-1)*(I-1)$ rounded up to the next multiple of I. In this manner, the beginning and end of the transition are aligned with the interleaving codeword boundary. The dummy insertion scheme as illustrated is similar to that in the triangular case. Considering the triangular interleaver as a stairway, then there are $(I-1)$ steps and the width of each step is constant—always M. For each step $\Delta M$ dummy bytes are inserted to transform the triangular structure from M1 to M2. In the case of GCI, the interleaver is a near triangular stairway in that the width of the $j_{th}$ step is $M_j$ ($=1, 2, \ldots, I-1$), which is not constant. To transform the GCI structure from $M1_j$ to $M2_j$, the number of dummy bytes for each step $\Delta M_j$ is not constant either. At the beginning of the transition, the interleaver input speed is switched from "Rate1" to "Rate2." During the transition, the interleaver output speed (or the line rate) is preferably maintained at the higher speed of "Rate1" and "Rate2," and the interleaving depth D is preferably maintained as the larger of D1 and D2.

In the "decrease of D" transition, the interleaver output speed (line rate) and the interleaving depth are changed at the end of the transition. Accordingly, the end of the "decrease of D" transition should be aligned with the DMT symbol boundary. In the "increase of D" transition, the interleaver output speed and the interleaving depth are changed at the beginning of the transition. Accordingly, the beginning of the "increase of D" transition should be aligned with the DMT symbol boundary. From this it is clear that the dynamic interleaver triangular configuration is a special case of the dynamic interleaver GCI configuration, i.e., when $D=M*I+1$. With the dummy bytes inserted as described above, the INP is maintained during the transition, i.e., the distance of the adjacent bytes within an interleaving block is still the larger of D1 and D2. For non-triangular GCI, i.e., when $D=M*I+x$ and $x \neq 1$, because the duration of the transition is $(D-1)*(I-1)$ rounded up to the next multiple of I, which is not exactly equal to the interleaving delay, there might be a worst-case delay variation of $(I-1)$ bytes at the $\alpha$-$\beta$ interface. This delay variation is relatively small, considered a "near zero" delay variation, when compared to the variations generated by other parts of the network and can be easily compensated.

Typically there will be design and implementation considerations that vary across applications and suppliers of equipment employing the present invention. The following is provided to further help in the context of implementation. One key difference between D.131 and the present invention is in the manner by which dummy bytes are inserted during transition. During interleaver transformation, the dummy insertion has the following two functions. First, to morph the interleaver to the desired shape, thus the interleaving depth D is changed. A sudden change of D causes an interruption of the data and does not allow maintaining a constant delay. In the other two schemes, the dummy bytes are inserted to change the length of each delay line. For each delay line, the total number of inserted dummy bytes is same in both schemes, but with different patterns. In D.131, the dummy bytes are grouped together, while in the present invention, they are distributed more evenly. They both fulfill the function of shaping the interleaver.

The second function of the dummy insertion is to minimize the delay variation during the transition to achieve the goal of "seamlessness." This requires that (1) at the interleaver output, the dummy bytes should be transmitted substantially evenly among the outgoing data ("perfectly" even may not be practical and would require a very sophisticated scheme); and (2) at the interleaver input, the incoming data should not be rejected or delayed. D.131 fails to satisfy this function because it causes a large delay variation. Preferably, in addition to these two constraints the dummy insertion does not impair INP.

As for dummy pattern generation, there are two common ways to generate dummy bytes. The easiest way is to generate the dummy bytes at the interleaver input and physically put the dummy bytes into the interleaver. This has the disadvantage of requiring more interleaving memory. A better although more complex alternative is to generate the dummy bytes at the interleaver output so that they are generated only when they are to be transmitted. In this manner, the dummy bytes do not physically occupy space in the interleaver.

Advantages of this third embodiment of the inventive dynamic interleaver configuration include: providing seamless on-line rate changes, e.g., SRA (seamless rate adaptation); near zero delay variation; DRR (dynamic rate repartitioning); and adaptive INP (impulse noise protection) preservation during transition. The invention is for use in VDSL2 applications.

Figure 23:
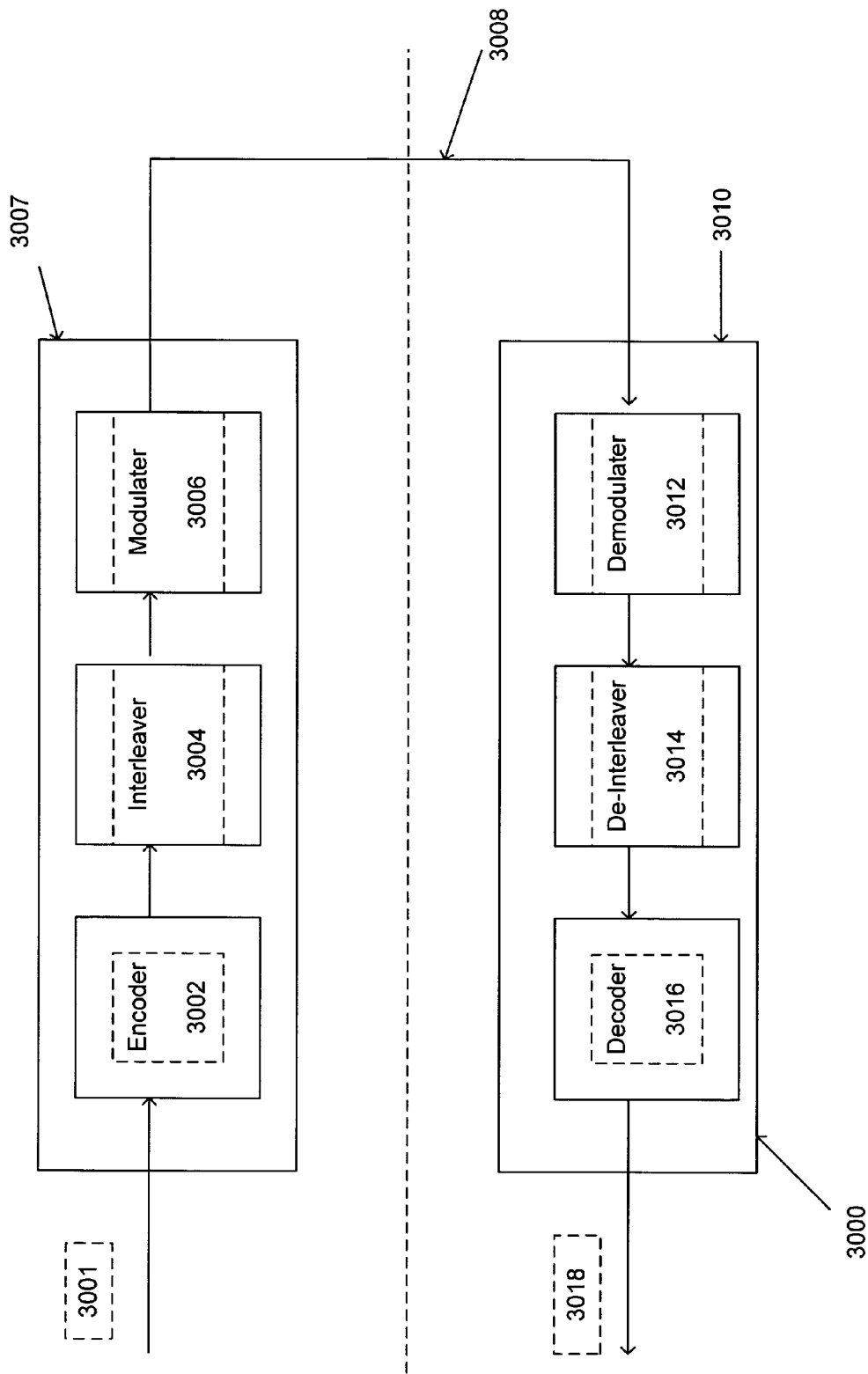
FIG. 23 is a block diagram illustrating a communications system embodiment incorporating the interleaving and de-interleaving schemes of the present invention.

FIG. 23 illustrates an exemplary communications system for use with the present invention in which a transmitter 3007, or transceiver in transmit mode, is in communication with a receiver 3010, or transceiver in receive mode, via communications network or connection 3008. Both the transmitter 3007 and the receiver 3010 utilize at least one, and likely both, of the dynamic interleaving/de-interleaving configurations of the present invention. Transmitter 3007 receives a data signal 3001 at its input which is delivered to an encoder 3002, which encodes the data and delivers the encoded data to interleaver 3004. The interleaver 3004 operates as described above using at least one of the dynamic interleaver configurations and delivers the encoded interleaved data signal to modulator 3006, which modulates the data signal and outputs the modulated signal from the transmitter along a communications path or channel 3008. The receiver 3010 receives the modulated data signal and inputs the signal into a demodulator 3012, which demodulates the signal. After demodulation, the signal is then processed using de-interleaver 3014 using the dynamic interleaving processes of the present invention as described above. The signal is further processed, decoded, at decoder 3016 and finally delivered to a destination device via output 3018. Memory elements, which may include registers and the like, are associated with the communications system to facilitate processing of the data. Some or all of the processing of the signal and data may be accomplished by processing devices or circuits such as commonly understood and appreciated by those skilled in the art.

Other embodiments, uses, and advantages of the invention will be apparent to those skilled in the art from consideration of the specification and practice of the invention disclosed herein. The specification and drawings should be considered exemplary only, and the scope of the invention is not intended to be limited to the exemplary embodiments.

The invention claimed is:

1. A communications system configured to perform an adaptive interleaver scheme comprising:
    an interleaver adapted to receive data and to interleave the received data to thereby generate interleaved data; and
    a de-interleaver adapted to receive the interleaved data and to de-interleave the received interleaved data to thereby generate data essentially equivalent to the received data;
    the interleaver defining a dummy insertion pattern in the received data prior to reordering of the received data to thereby form transition data to effect interleaver depth (D) and interleaver shape and to accommodate interleaver line rates to minimize delay variations and to maintain impulse noise protection (INP).

2. The communications system of claim 1, wherein the interleaver redefines the dummy insertion pattern to change the interleaver depth and shape to accommodate the interleaver line rates to minimize delay variations and to maintain the impulse noise protection (INP).

3. The communications system of claim 1, wherein the delay variations and INP are inverse-proportional to the interleaver line rates and wherein quality of data is maintained by changing the interleaver depth in proportion to the interleaver line rates.

4. The communications system of claim 3, wherein the delay variations and INP are respectively defined by the following equations:

$$\text{Delay(ms)} = \frac{8 \cdot (D-1) \cdot (I-1)}{LineRate(kb/s)} \text{ and } INP(\text{ms}) = \frac{t}{q} \cdot \frac{8 \cdot D}{LineRate(kb/s)}$$

wherein D represents interleaving depth, I represents an interleaving block size, t and q represent forward error correction (FEC) parameters.

5. The communications system of claim 4, wherein during rate adaptation FEC parameters N and R are unchanged and an interleaving block I is unchanged and interleaving depth (D-1) changes in proportion to the interleaver line rates, whereby the delay remains constant.

6. The communications system of claim 5, wherein the INP is maintained at no less than a minimum INP_mm for all possible rates by selecting initial FEC/interleaver parameters at a training stage to achieve a degree of over-provisioning in accordance with the following equation:

$$M_j = L_j - L_{j-1} = M + \left\lfloor \frac{j \cdot x}{I} \right\rfloor - \left\lfloor \frac{(j-1) \cdot x}{I} \right\rfloor,$$

wherein M is an interleaving depth parameter, L is a length of a delay line, x represents dummy bytes, and j represents a delay line index.

7. The communications system of claim 1, wherein interleaving performed by the interleaver comprises convolutional interleaving.

8. The communications system of claim 1, wherein de-interleaving performed by the de-interleaver comprises convolutional de-interleaving.

9. A communications system, comprising:
an encoder adapted to receive and encode a signal and generate an encoded signal;
an interleaver adapted to receive and interleave the encoded signal to thereby generate an interleaved encoded signal, the interleaver defining a dummy insertion pattern in the received signal prior to reordering of the received signal to thereby form a transition signal to effect interleaver depth (D) and interleaver shape and to accommodate interleaver line rates to minimize delay variations and to maintain impulse noise protection (INP);
a modulator that modulates the interleaved encoded signal to generate an encoded interleaved modulated signal;
a demodulator adapted to receive and demodulate the modulated interleaved encoded signal and generate a demodulated interleaved encoded signal;
a de-interleaver adapted to receive and deinterleave the demodulated interleaved encoded signal and generate a deinterleaved demodulated encoded signal; and
a decoder adapted to decode the deinterleaved demodulated encoded signal and generate an output signal essentially equivalent to the received signal.

10. The communications system of claim 9, wherein the interleaver redefines the dummy insertion pattern to change the interleaver depth and shape to accommodate the interleaver line rates to minimize delay variations and to maintain the impulse noise protection (INP).

11. The communications system of claim 10, wherein the delay variations and INP are inverse-proportional to the interleaver line rates and wherein quality of signal is maintained by changing the interleaver depth in proportion to the interleaver line rates.

12. The communications system of claim 11, wherein the delay variations and INP are respectively defined by the following equations:

$$\text{Delay(ms)} = \frac{8 \cdot (D-1) \cdot (I-1)}{\text{LineRate(kb/s)}} \text{ and } \text{INP(ms)} = \frac{t}{q} \cdot \frac{8 \cdot D}{\text{LineRate(kb/s)}}$$

wherein D represents interleaving depth, I represents an interleaving block size, t and q represent forward error correction (FEC) parameters.

13. The communications system of claim 12, wherein during rate adaptation FEC parameters N and R are unchanged and an interleaving block I is unchanged and interleaving depth (D-1) changes in proportion to the interleaver line rates, whereby the delay remains constant.

14. The communications system of claim 13, wherein the INP is maintained at no less than a minimum INP_min for all possible rates by selecting initial FEC/interleaver parameters at a training stage to achieve a degree of over-provisioning in accordance with the following equation $$M_j = L_j - L_{j-1} = M + \left\lfloor \frac{j \cdot x}{I} \right\rfloor - \left\lfloor \frac{(j-1) \cdot x}{I} \right\rfloor,$$

wherein M is an interleaving depth parameter, L is a length of a delay line, x represents dummy bytes, and j represents a delay line index.

15. A communications system configured to perform an adaptive interleaver scheme comprising:
an interleaver means for receiving data and interleaving the received data to thereby generate interleaved data; and
a de-interleaver means for receiving the interleaved data and deinterleaving the received interleaved data to thereby generate data essentially equivalent to the received data;
the interleaver means defining a dummy insertion pattern in the received data prior to reordering of the received data to thereby form transition data to effect interleaver depth (D) and interleaver shape and to accommodate interleaver line rates to minimize delay variations and to maintain impulse noise protection (INP).

16. The communications system of claim 15, wherein the interleaver means redefines the dummy insertion pattern to change the interleaver depth and shape to accommodate the interleaver line rates to minimize delay variations and to maintain the impulse noise protection (INP).

17. The communications system of claim 15, wherein the delay variations and INP are inverse-proportional to the interleaver line rates and wherein quality of data is maintained by changing the interleaver depth in proportion to the interleaver line rates.

18. A communications system, comprising:
an encoder adapted to receive and encode a signal and generate an encoded signal;
an interleaver means for receiving and interleaving the encoded signal to thereby generate an interleaved encoded signal, the interleaver means defining a dummy insertion pattern in the received signal prior to reordering of the received signal to thereby form a transition signal to effect interleaver depth (D) and interleaver shape and to accommodate interleaver line rates to minimize delay variations and to maintain impulse noise protection (INP);
a modulator that modulates the interleaved encoded signal to generate an encoded interleaved modulated signal;
a demodulator adapted to receive and demodulate the modulated interleaved encoded signal and generate a demodulated interleaved encoded signal;
a de-interleaver means for receiving and deinterleaving the demodulated interleaved encoded signal and generating a deinterleaved demodulated encoded signal; and
a decoder adapted to decode the deinterleaved demodulated encoded signal and generate an output signal essentially equivalent to the received signal.

19. The communications system of claim 18, wherein the interleaver means redefines the dummy insertion pattern to change the interleaver depth and shape to accommodate the interleaver line rates to minimize delay variations and to maintain the impulse noise protection (INP).

20. The communications system of claim 18, wherein the delay variations and INP are inverse-proportional to the interleaver line rates and wherein quality of signal is maintained by changing the interleaver depth in proportion to the interleaver line rates.

21. A method of performing an adaptive interleaver scheme comprising:

receiving data at an interleaver and interleaving the received data to thereby generate interleaved data;

receiving at a deinterleaver the interleaved data and deinterleaving the received interleaved data to thereby generate data essentially equivalent to the received data; and defining at the interleaver a dummy insertion pattern in the received data prior to reordering of the received data to thereby form transition data to effect interleaver depth (D) and interleaver shape and to accommodate interleaver line rates to minimize delay variations and to maintain impulse noise protection (INP).

22. The method of claim 21, further comprising redefining at the interleaver the dummy insertion pattern to change the interleaver depth and shape to accommodate the interleaver line rates to minimize delay variations and to maintain the impulse noise protection (INP).

23. The method of claim 21, wherein the delay variations and INP are inverse-proportional to the interleaver line rates and wherein quality of data is maintained by changing the interleaver depth in proportion to the interleaver line rates.

24. The method of claim 23, wherein the delay variations and INP are respectively defined by the following equations:

$$\text{Delay(ms)} = \frac{8 \cdot (D-1) \cdot (I-1)}{LineRate(kb/s)} \text{ and } INP(\text{ms}) = \frac{t}{q} \cdot \frac{8 \cdot D}{LineRate(kb/s)}$$

wherein D represents interleaving depth, I represents an interleaving block size, t and q represent forward error correction (FEC) parameters.

25. The method of claim 24, wherein during rate adaptation FEC parameters N and R are unchanged and an interleaving block I is unchanged and interleaving depth (D-1) changes in proportion to the interleaver line rates, whereby the delay variations remains constant.

26. The method of claim 25, wherein the INP is maintained at no less than a minimum INP_min for all possible rates by selecting initial FEC/interleaver parameters at a training stage to achieve a degree of over-provisioning in accordance with the following equation:

$$M_j = L_j - L_{j-1} = M + \left\lfloor \frac{j \cdot x}{I} \right\rfloor - \left\lfloor \frac{(j-1) \cdot x}{I} \right\rfloor,$$

wherein M is an interleaving depth parameter, L is a length of a delay line, x represents dummy bytes, and j represents a delay line index.

* * * * *

UNITED STATES PATENT AND TRADEMARK OFFICE
CERTIFICATE OF CORRECTION

Page 1 of 1

PATENT NO. : 7,466,758 B2
APPLICATION NO. : 11/297632
DATED : December 16, 2008
INVENTOR(S) : Xu et al.

It is certified that error appears in the above-identified patent and that said Letters Patent is hereby corrected as shown below:

Column 18, Line 58:
delete "INP_mm" and replace with --INP_min--

Signed and Sealed this
Thirteenth Day of September, 2011

David J. Kappos
*Director of the United States Patent and Trademark Office*